(12) United States Patent
Tada et al.

(10) Patent No.: US 8,278,763 B2
(45) Date of Patent: Oct. 2, 2012

(54) SEMICONDUCTOR DEVICE

(75) Inventors: Munehiro Tada, Tokyo (JP); Hiroto Ohtake, Tokyo (JP); Fuminori Ito, Tokyo (JP); Yoshihiro Hayashi, Tokyo (JP); Hironori Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/238,796

(22) Filed: Sep. 21, 2011

(65) Prior Publication Data

US 2012/0013023 A1  Jan. 19, 2012

Related U.S. Application Data

(62) Division of application No. 12/299,375, filed as application No. PCT/JP2007/060012 on May 16, 2007, now Pat. No. 8,043,957.

(30) Foreign Application Priority Data

May 17, 2006 (JP) .................................. 2006-137457

(51) Int. Cl.
*H01L 23/48* (2006.01)
*H01L 23/52* (2006.01)

(52) U.S. Cl. .................... 257/774; 257/760; 257/762

(58) Field of Classification Search .......... 257/758–760, 257/762, 773, 774, 21.261, E21.575
See application file for complete search history.

(56) References Cited

U.S. PATENT DOCUMENTS

| | | | |
|---|---|---|---|
| 6,261,944 B1 | 7/2001 | Mehta et al. | |
| 6,358,838 B2 | 3/2002 | Furusawa et al. | |
| 6,642,145 B1 | 11/2003 | Avanzino et al. | |
| 6,680,541 B2 | 1/2004 | Furusawa et al. | |
| 6,787,446 B2 | 9/2004 | Enomoto et al. | |
| 7,091,618 B2 | 8/2006 | Yoshizawa et al. | |
| 7,268,434 B2 * | 9/2007 | Nakashima | 257/774 |

(Continued)

FOREIGN PATENT DOCUMENTS

JP  2001-203200  7/2001

(Continued)

OTHER PUBLICATIONS

Japanese Office Action dated Jul. 27, 2012 issued by the Japanese Patent Office in counterpart Japanese Patent Application No. 2008-515581 with English translation of portion enclosed in wavy lines, 7 pages.

*Primary Examiner* — Hung Vu

(74) *Attorney, Agent, or Firm* — Young & Thompson

(57) ABSTRACT

The present invention provides a multilayer wiring technology by which high adhesiveness and high insulation reliability between wirings are obtained, while maintaining effective low capacitance between wirings. A semiconductor device is characterized in that a first insulating film is an insulating film formed of at least one layer which contains a siloxane structure containing silicon, oxygen and carbon; the siloxane structure in the inner part of the first insulating film contains a larger number of carbon atoms than the number of silicon atoms; and a modified layer which containing a smaller number of carbon atoms and a larger number of oxygen atoms per unit volume than the inner part of the first insulating film is formed on at least one of an interface between the first insulating film and the metal and an interface between the first insulating film and a second insulating film.

11 Claims, 15 Drawing Sheets

U.S. PATENT DOCUMENTS

| | | | |
|---|---|---|---|
| 7,737,561 B2 * | 6/2010 | Kumar et al. | 257/774 |
| 8,022,497 B2 * | 9/2011 | Shishida et al. | 257/499 |
| 2001/0009295 A1 | 7/2001 | Furusawa et al. | |
| 2002/0105085 A1 | 8/2002 | Furusawa et al. | |
| 2003/0054656 A1 | 3/2003 | Soda | |
| 2003/0186534 A1 | 10/2003 | Nambu | |
| 2005/0151266 A1 | 7/2005 | Yoshizawa et al. | |

FOREIGN PATENT DOCUMENTS

| | | |
|---|---|---|
| JP | 2002-26121 | 1/2002 |
| JP | 2002-526916 | 8/2002 |
| JP | 2003-92287 | 3/2003 |
| JP | 2003-282704 | 10/2003 |
| JP | 2003-309173 | 10/2003 |
| JP | 2004-207604 | 7/2004 |
| JP | 2005-166716 | 6/2005 |
| JP | 2005-197606 | 7/2005 |
| JP | 2005-217371 | 8/2005 |
| JP | 2006-19377 | 1/2006 |
| JP | 2006-024641 | 1/2006 |
| JP | 2006-059982 | 3/2006 |
| WO | WO 2005/053008 | 6/2005 |
| WO | WO 2005/053009 | 6/2005 |

* cited by examiner

SEMICONDUCTOR DEVICE

TECHNICAL FIELD

The present invention relates to a semiconductor device comprising a multilayer wiring, a method for manufacturing a semiconductor device and an apparatus for manufacturing a semiconductor, and particularly relates to a semiconductor device which is formed of a damascene wiring structure comprising Cu as a main component, and the like.

BACKGROUND ART

In a silicon semiconductor integrated circuit (LSI), conventionally aluminum (Al) or an Al alloy has been widely used as an electroconductive material. As the tendency of a method for manufacturing finer LSI progresses, copper (Cu) has been used as an electroconductive material so as to decrease the resistance of a wire in wiring and enhance the reliability. This Cu easily diffuses into a silicon oxide film, so that an electroconductive barrier metal film for preventing the diffusion of Cu is used in the side face and the bottom face of Cu wiring, and an insulative barrier film is used in the top face of the Cu wiring.

By the way, as the tendency of refining LSI progresses recently, a wiring dimension has been further refined. Then, a problem has arisen that the capacitance between wirings increases, and an insulating film with a low dielectric constant is progressively introduced for an interlayer insulating film. This is because it is effective not only to refine the wiring but also lower the dielectric constant of the interlayer insulating film, and both methods are required in combination, in order to drive a semiconductor element using a multilayer wiring at a high speed and a low electric power.

In order to decrease the effective capacitance between the wirings in this way, it has been required to lower the dielectric constant of the interlayer insulating film (in this case, silicon oxide film (k=4.2)). Examples of this insulating film with a low dielectric constant include a HSQ (Hydrogen Silsesquioxane) film, CDO (Carbon doped oxide), and an organic film. These insulating films with a low dielectric constant are formed with a spin coating method, a vapor phase method or the like.

Japanese Patent Laid-Open No. 2003-309173 discloses a technology of forming a modified layer by subjecting an organosiloxane film to $NF_3$ plasma treatment and enhancing the adhesiveness.

Japanese Patent Laid-Open No. 2006-24641 discloses a technology of forming a modified layer by subjecting an organosiloxane film to a reducing treatment and protecting the organosiloxane film.

National Publication of International Patent Application No. 2002-526916 discloses a technology of forming a porous insulating film by using a cyclic organosiloxane as a raw material.

Japanese Patent Application No. 2003-400683 discloses a technology of forming a porous insulating film by using a three-membered cyclic organosiloxane as a raw material.

DISCLOSURE OF THE INVENTION

As is described in the above described document, a porous insulating film having a dielectric constant of 2.5 or less is formed by using an organosiloxane film, in the related art. However, at the same time, a multilayer wiring has been desired which can practically show all of low capacitance between wirings, high adhesiveness and high wiring reliability.

Here, a technique of forming a modified layer on the organosiloxane film and enhancing the process resistance is used as an integration technology for the organosiloxane film. However, the modified layer has a problem of having a high dielectric constant because carbon is released when the modified layer is formed and increasing the capacitance between the wirings. Accordingly, when the modified layer is employed, it has been desired that the modified layer is formed so as to have a low dielectric constant and also be thin.

Japanese Patent Laid-Open No. 2003-309173 describes a technology of forming a modified layer by treating the surface of an organosiloxane film with plasma, particularly, by treating the surface with $NF_3$ plasma. This technology can improve the adhesiveness by treating the surface with the $NF_3$ plasma, but contrarily has a problem of deteriorating heat resistance due to fluorine taken into the inner part of the film. In other words, the modified layer to be formed is needed to have stability.

Japanese Patent Laid-Open No. 2006-24641 discloses a technology of forming a modified layer by treating an organosiloxane film with plasma. However, the technology described in Japanese Patent Laid-Open No. 2006-24641 has a problem that when an organosiloxane film having a dielectric constant of 2.5 or less is formed with the technology, the modified layer is thickly formed, consequently, shows a high dielectric constant and increases the capacitance between the wirings.

On the other hand, an insulating film with a low dielectric constant which can realize the dielectric constant of 2.5 or less in this way can be formed by using a cyclic type of an organosiloxane as a raw material, as is described in National Publication of International Patent Application No. 2002-526916 and Japanese Patent Application No. 2003-400683. However, this insulating film with a low dielectric constant has a problem of increasing a leakage current between the wirings when applied to an interlayer insulating film between the wirings so as to achieve the low capacitance between the wirings. In other words, the insulating film with the low dielectric constant decreases the capacitance between the wirings, but increases the power consumption of the whole chip due to the leakage current between the wirings, and deteriorates the insulation reliability between the wirings, which practically causes a serious problem.

The present invention has been designed so as to solve the above described problem, and provides a multilayer wiring technology by which high adhesiveness and high insulation reliability between wirings are obtained, while maintaining effective low capacitance between the wirings.

In order to maintain the capacitance between the wirings low and to form a modified layer having superior adhesiveness and insulation properties as is described above, the modified layer needs to be formed as thinly as possible. In order to do this, not only an approach of a modified treatment process but also an approach from a structure, a composition and a material of a siloxane film to be modified is necessary, and it is necessary to design a process flow while taking both approaches into consideration.

Then, the present inventors made an investigation for the semiconductor device which uses siloxane as a raw material, and as a result, have found a semiconductor device comprising a modified layer showing a preferable effect.

Specifically, the present invention forms a modified layer in at least one of an interface between a first insulating film and a metal and an interface between the first insulating film and a second insulating film. The modified layer has its peculiarity in a point of having the number of carbon atoms per unit volume less than that in the first insulating film and having the number of oxygen atoms per unit volume more than that in the first insulating film.

Thus formed modified layer can be thin, show superior insulation properties, and can lower a leakage current between wirings while maintaining the low capacitance between the wirings. Such an effect of lowering the leakage current between the wirings has not been expected before the modified layer according to the present invention is found.

A first insulating film including a siloxane structure preferably has the number of carbon atoms more than that of oxygen atoms per unit volume, in the inner part. When being formed in such a way, the modified layer can improve the adhesivenesses between the first insulating film including the siloxane structure and a second insulating film and between the first insulating film and metal wiring.

The reason is because when an insulating film including a preferable siloxane structure is subjected to a preferable modification treatment, oxygen which has substituted for carbon and sequentially bonded siloxane units with a high density to each other, resulting in forming a thin modified layer having a nanometric level and high density. In addition, this is also because this modified layer is a layer having superior adhesiveness and insulation properties. When such a modified layer is used as a side wall protection layer, an adhesion layer and an etch-stop layer, the modified layer can enhance the working controllability, the adhesiveness, the insulation reliability and the like.

Here, in order to confirm the effect of the present invention, the result of the experiment is shown in which SiOCH films having different structures and compositions have been irradiated with oxygen plasma.

At first, a film of a three-membered cyclic type SiOCH was formed by using a three-membered cyclic organosiloxane (the following Formula (1)) as a raw material; a film of a cyclic type SiOCH was formed by using a four-membered cyclic organosiloxane (the following Formula (2)) as a raw material; and a film of a random type SiOCH was formed by using a straight-chain organosiloxane (the following Formula (3)) as a raw material, all with a plasma vapor-deposition method. Then, the variation in a dielectric constant by being irradiated with $O_2$ plasma was measured. Respective films showed the dielectric constant of k=2.4 for Formula (1), k=2.6 for Formula (2), and k=2.7 for Formula (3).

[Formula 1]

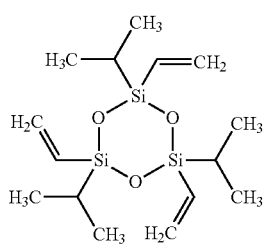

(1)

[Formula 2]

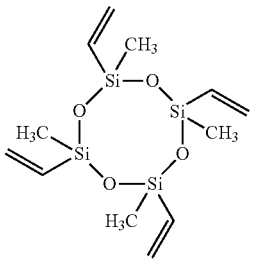

(2)

[Formula 3]

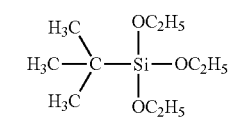

(3)

FIG. 1 shows a Raman spectrum of a film of the three-membered cyclic type SiOCH as an example of the Raman spectrum. A spectrum of the three-membered cyclic siloxane detected in the vicinity of 580 cm$^{-1}$ shows that an insulating film having a cyclic Si—O skeleton has been formed which reflects a siloxane structure of the raw material. Thus, the siloxane structure can be analyzed by using Raman analysis.

Table 1 shows a composition of each formed insulating film, which has been measured through an RBS/HFS analysis. It is understood that a ratio (C/Si) of carbon atoms to silicon atoms in the film increases in the following sequence: Formula (3) (random type SiOCH film)<Formula (2) (four-membered cyclic type SiOCH film)<Formula (1) (three-membered cyclic type SiOCH film).

TABLE 1

|  | Si | O | C |
|---|---|---|---|
| Three-membered cyclic type SiOCH | 1 | 1 | 3 |
| Four-membered cyclic type SiOCH | 1 | 1 | 2.2 |
| Random SiOCH | 1 | 1 | 0.7 |

FIG. 2 shows a plot of the change of the dielectric constants of the above described three types of insulating films along with an oxidation treatment period of time. Here, the insulating films are irradiated with $O_2$ plasma in a parallel plate type in-situ ashing apparatus, under conditions of the distance between substrates (GAP) of 30 mm, the pressure of 10 mTorr, the upper electrode frequency of 60 MHz, the upper electrode power of 600 W, the lower electrode frequency of 13.56 MHz, and the lower electrode power of 100 W, by using only oxygen gas.

It is understood from FIG. 2 that the increase of the dielectric constant due to the oxidation treatment time decreases in the following sequence: Formula (3) (random type SiOCH film), Formula (2) (four-membered cyclic type SiOCH film) and Formula (1) (three-membered cyclic type SiOCH film). In addition, the thickness of the modified layer which has been formed on the surface was estimated through a depth direction analysis by XPS (X-ray Photoelectron Spectroscopy). As a result, it was found that the thickness was smaller in order of 40 nm (random type SiOCH film)>20 nm (four-membered cyclic type SiOCH film)>10 nm (three-membered cyclic type SiOCH film). Furthermore, the density of the modified layer which has been formed on the surface of the film of the three-membered cyclic type SiOCH was measured with XRR (X-Ray Reflection: measurement of reflectance by X-Ray). As a result, it was found that the density was 2.0 g/cm$^3$ or more.

As is shown in the result on the above described Formula (2) (four-membered cyclic type SiOCH film) and Formula (1) (three-membered cyclic type SiOCH film), it is understood that the insulating film comprising a siloxane structure having a larger number of carbon atoms than the number of silicon atoms shows a better result after having been modified. In other words, the feature of the present invention is to substitute oxygen or nitrogen for carbon in an insulating film including such a preferable siloxane structure by preferable modification treatment, and thinly form a modified layer having high density, resulting in preventing the modification from proceeding to the inner part of the film.

The reason why the film composition containing a larger number of carbon atoms than the number of silicon atoms in this siloxane structure is preferable is because the insulating film itself shows a lowered dielectric constant by the increase of atoms of carbon which is a light element. In addition to this, the reason is also because the insulating film can suppress the rapid drawing of carbon due to the modification treatment, makes a densification reaction proceed along with a displacement reaction of carbon, and can have a modified layer with a nanometric level of thickness and high density formed thereon.

Particularly, the siloxane structure preferably includes both of a hydrocarbon group including at least 3 carbon atoms and an unsaturated hydrocarbon group. When the siloxane structure thus includes both of the unsaturated hydrocarbon group and the hydrocarbon group including 3 or more carbon atoms, the siloxane structure can lower the decarbonization speed by a strong binding energy of the unsaturated hydrocarbon group, and can retain many hydrocarbon components in the film by the hydrocarbon group including many carbon atoms.

The reason why a modified layer having high density can be formed rather in a cyclic siloxane structure than in a random type siloxane structure though the film has a lower dielectric constant is because the cyclic structure having a less member has a smaller bond angle of O—Si—O, and accordingly tends to form an SiO structure having a higher density.

The fact that coesite (four-membered ring; 2.92 g/cm$^3$) has higher density than quartz (six-membered ring; 2.65 g/cm$^3$) is taken as an example. Accordingly, the insulating film preferably contains the cyclic siloxane previously therein as a skeleton, which tends to form the O—Si—O structure having high density, and then can easily make a modified layer formed thereon which is thin and has high density, by making oxygen having substituted for carbon continuously bond the cyclic units.

In order to form the modified layer so that the modified layer surrounds around the metal wiring and a connecting plug, any film of an interlayer insulating film between wirings, a hard mask film and an interlayer insulating film between vias, all of which contact the metal wiring and the connecting plug, is preferably a first insulating film containing a siloxane structure containing at least silicon, oxygen and carbon. In addition, any insulating film preferably contains a siloxane structure containing both of a side chain including 3 or more carbon atoms and a vinyl group.

The above described interlayer insulating film between the wirings, the hard mask film and the interlayer insulating film between the vias can be separately formed by changing a partial pressure of the raw material, while plasma is excited, which is modification treatment. For instance, the interlayer insulating film between the vias can be formed by employing a low partial pressure condition, the interlayer insulating film between the wirings can be formed by employing a high partial pressure condition, and a hard mask film and the interlayer insulating film between the vias which have comparatively superior adhesiveness and film strength can be formed by employing a low partial pressure condition.

Alternatively, the above described interlayer insulating film between the wirings, the hard mask film and the interlayer insulating film between the vias can be separately formed by using two or more raw materials of siloxane containing both of a side chain including 3 or more carbon atoms and a vinyl group, and forming the films while changing the ratio of these raw materials. In this case, the interlayer insulating film between the vias can be formed into an SiOCH film having the C/Si ratio of approximately 1.4 and the dielectric constant of 2.7, the interlayer insulating film between the wirings into an SiOCH film having the C/Si ratio of approximately 2.9 and the dielectric constant of 2.4, and the hard mask film into an SiOCH film having the C/Si ratio of approximately 1.2 and the dielectric constant of 3.0, by changing the ratio of the raw materials. The modified layer according to the present invention is formed in any insulating film, and thereby, the modified layer is formed so as to surround the wire except the top face of the wire, and can further enhance the adhesiveness.

In the case of this wiring structure, the hard mask film secures the strength by the film having comparatively high dielectric constant because the hard mask film is exposed to CMP, and dielectric constant of the interlayer insulating film between the vias is lowered by slightly decreasing the number of carbon atoms compared to that of the hard mask film. The interlayer insulating film between the wirings contains a large number of carbon atoms so as to have the lowest dielectric constant. Accordingly, when any film of the hard mask film, the interlayer insulating film between the wirings, and the interlayer insulating film between the vias is an insulating film containing a siloxane structure containing at least silicon, oxygen and carbon, the number of the carbon atoms per unit volume in the insulating film is increased in order of the interlayer insulating film between the wirings>the interlayer insulating film between the vias>the hard mask film. Then, the films can acquire further improved adhesiveness. In addition, the number of carbon atoms in the modified layer per unit volume is decreased in order of the modified layer between the interlayer insulating film between the wirings and metal>the modified layer between the interlayer insulating film between the vias and the metal>the modified layer between the hard mask film and the metal. Thereby, the modified layer can improve adhesiveness between these layers.

The siloxane structure in the inner part of the first insulating film contains a larger number of carbon atoms than the number of silicon atoms, so that the density in the inner part of the first insulating film is typically 1.2 g/cm$^3$ or smaller.

Then, the present invention has the following constitution.

1. A semiconductor device including a multilayer wiring comprising a wiring groove and a via hole formed in an insulating film on a semiconductor substrate, and a wire and a connecting plug formed from a metal respectively filled in the wiring groove and the via hole, in which at least one part of the insulating film is formed of a first insulating film and a second insulating film, wherein the first insulating film is at least one layer insulating film including a siloxane structure containing silicon, oxygen and carbon, the siloxane structure in the inner part of the first insulating film contains a larger number of carbon atoms than the number of silicon atoms, and a modified layer containing a smaller number of carbon atoms and a larger number of oxygen atoms per unit volume than the inner part of the first insulating film is formed on at least one of an interface between the first insulating film and the metal and an interface between the first insulating film and the second insulating film.

2. The semiconductor device according to the above described 1,
wherein the first insulating film containing the siloxane structure contains a larger number of carbon atoms than the number of oxygen atoms per unit volume in the inner part.

3. The semiconductor device according to the above described 1 or 2,
wherein the siloxane structure contains both of a hydrocarbon group including at least 3 carbon atoms and an unsaturated hydrocarbon group.

4. The semiconductor device according to any one of the above described 1 to 3,
wherein the siloxane structure includes a cyclic siloxane structure containing an oxygen atom and a silicon atom.

5. The semiconductor device according to the above described 4,
wherein the cyclic siloxane structure is formed of a three-membered cyclic structure including three Si—O units each of which is formed of an oxygen atom and a silicon atom.

6. The semiconductor device according to any one of the above described 1 to 5,
wherein the modified layer contains a larger number of oxygen atoms than the number of carbon atoms per unit volume.

7. The semiconductor device according to any one of the above described 1 to 5,
wherein the modified layer contains a larger number of oxygen atoms and nitrogen atoms in total than the number of carbon atoms per unit volume.

8. The semiconductor device according to any one of the above described 1 to 7,
wherein the modified layer has a thickness of 20 nm or less.

9. The semiconductor device according to any one of the above described 1 to 8,
wherein the modified layer has a density of 2.0 g/cm$^3$ or larger.

10. The semiconductor device according to any one of the above described 1 to 9,
wherein the first insulating film has the density of 1.2 g/cm$^3$ or smaller in the inner part.

11. The semiconductor device according to any one of the above described 1 to 10,
wherein the first insulating film is formed of an interlayer insulating film between vias in a via plug portion, an interlayer insulating film between wirings in a wiring portion and a hard mask film in the wiring portion, which is sequentially stacked from a semiconductor substrate side,
any film of the hard mask film, the interlayer insulating film between the wirings and the interlayer insulating film between the vias is an insulating layer containing a siloxane structure containing silicon, oxygen and carbon,
the modified layers are formed on any of an interface between the hard mask film and the metal, an interface between the interlayer insulating film between the wirings and the metal, and an interface between the interlayer insulating film between the vias and the metal,
the modified layers have the composition containing a smaller number of carbon atoms and a larger number of oxygen atoms per unit volume than the inner part of the first insulating film corresponding to each of the modified layers, and the number of carbon atoms per unit volume in the modified layers decreases in order of the modified layer between the interlayer insulating film between the wirings and the metal>the modified layer between the interlayer insulating film between the vias and the metal>the modified layer between the hard mask film and the metal.

12. A method for manufacturing a semiconductor device including a multilayer wiring comprising a wiring groove and a via hole formed in an insulating film on a semiconductor substrate, and a wire and a connecting plug formed from a metal respectively filled in the wiring groove and the via hole, in which at least one part of the insulating film is formed of a first insulating film,
wherein the first insulating film is at least one layer insulating film including a siloxane structure containing silicon, oxygen and carbon,
the siloxane structure in the inner part of the first insulating film contains a larger number of carbon atoms than the number of silicon atoms, and
the semiconductor device comprises a modified layer containing a smaller number of carbon atoms and a larger number of oxygen atoms per unit volume than the inner part of the first insulating film on an interface between the first insulating film and the metal, the method comprising:
forming the insulating film which forms the first insulating film containing the siloxane structure;
forming a hard mask film on the first insulating film;
applying a photoresist to the hard mask film and then patterning a groove thereon;
forming a mask pattern through forming a groove in the hard mask film by a dry etching using the photoresist as a mask;
removing the photoresist by an oxygen ashing;
forming a groove which forms the wiring groove and the via hole in the first insulating film by a dry etching using the mask pattern as a mask;
performing a modification which forms the modified layer by performing modification treatment onto side faces of the wiring groove and the via hole in the first insulating film; and
forming the wire and the connecting plug respectively by filling the wiring groove and the via hole with the metal.

13. A method for manufacturing a semiconductor device including a multilayer wiring comprising a wiring groove and a via hole formed in an insulating film on a semiconductor substrate, and a wire and a connecting plug formed from a metal respectively filled in the wiring groove and the via hole, in which at least one part of the insulating film is formed of a first insulating film and a second insulating film,
wherein the first insulating film is at least one layer insulating film including a siloxane structure containing silicon, oxygen and carbon,
the siloxane structure in the inner part of the first insulating film contains a larger number of carbon atoms than the number of silicon atoms, and
the semiconductor device comprises a modified layer containing a smaller number of carbon atoms and a larger number of oxygen atoms per unit volume than the inner part of the first insulating film on an interface between the first insulating film and the metal and an interface between the first insulating film and the second insulating film, the method comprising:
forming the second insulating film containing a cyclic siloxane structure containing silicon, oxygen and carbon;

forming the modified layer by performing modification treatment onto a surface of the second insulating film; forming the insulating film which forms the first insulating film on the modified layer;

forming a hard mask film on the first insulating film; applying a photoresist to the hard mask film and then patterning a groove thereon;

forming a mask pattern through forming a groove in the hard mask film by a dry etching using the photoresist as a mask;

removing the photoresist by an oxygen ashing;

forming the groove which forms the wiring groove and the via hole in the first insulating film and the second insulating film by a dry etching using the mask pattern as a mask;

performing a modification which forms the modified layer by performing modification treatment onto side faces of the wiring groove and the via hole in the first insulating film and the second insulating film; and forming the wire and the connecting plug respectively by filling the wiring groove and the via hole with the metal.

14. The method for manufacturing a semiconductor device according to the above described 12 or 13, wherein the modification treatment is an oxidation treatment.

15. The method for manufacturing a semiconductor device according to the above described 14, wherein the oxidation treatment is treatment with the use of oxygen plasma.

16. The method for manufacturing a semiconductor device according to the above described 15, wherein the oxygen plasma is a mixture gas of oxygen and Ar into a plasma state.

17. The method for manufacturing a semiconductor device according to the above described 15 or 16, wherein the oxygen plasma is formed by applying a substrate bias to a gas containing oxygen to convert the gas containing oxygen to a plasma state.

18. The method for manufacturing a semiconductor device according to the above described 14, wherein the oxidation treatment is carried out by using an ultraviolet ray and ozone.

19. The method for manufacturing a semiconductor device according to the above described 14, wherein the oxidation treatment is carried out by using an oxygen annealing operation.

20. The method for manufacturing a semiconductor device according to the above described 12 or 13, wherein the modification treatment is carried out by using nitrogen plasma.

21. The method for manufacturing a semiconductor device according to any one of the above described 12 to 20, wherein in forming the groove, an etching gas used in the dry etching is a mixture gas containing at least Ar, $N_2$, $O_2$ and $CF_4$.

22. An apparatus for manufacturing a semiconductor used in the method for manufacturing a semiconductor device according to any one of the above described 12 to 21, wherein the apparatus comprises controlling means including a microcomputer which a program for controlling forming the groove, removing the photoresist and performing the modification is stored therein.

23. The apparatus for manufacturing a semiconductor according to the above described 22, wherein the controlling means further stores a program therein for forming the first insulating film by a plasma treatment sequence in forming the insulating film.

24. The apparatus for manufacturing a semiconductor according to the above described 23, wherein the plasma treatment sequence is a sequence of oxygen plasma treatment.

25. The apparatus for manufacturing a semiconductor according to the above described 23, wherein the plasma treatment sequence is a sequence of nitrogen plasma treatment.

By employing the method for manufacturing a semiconductor device, the apparatus for manufacturing the semiconductor, and the semiconductor device according to the present invention, the interlayer insulating film can lower its dielectric constant and enhance its insulation reliability at the same time; and acquires high adhesiveness, which eventually enhances the performance of wiring, and enables LSI operatable with a high speed and a low electric power to be formed with a high degree of reliability.

In the above "13", the modification treatment in "forming the modified layer by performing modification treatment on a surface of the second insulating film" and the modification treatment is preferably oxidation treatment.

In the above aspect "13", the modification treatment in "forming the modified layer by performing modification treatment on a surface of the second insulating film" and the modification treatment is preferably carried out by using nitrogen plasma.

DESCRIPTION OF SYMBOLS

Figure 1:
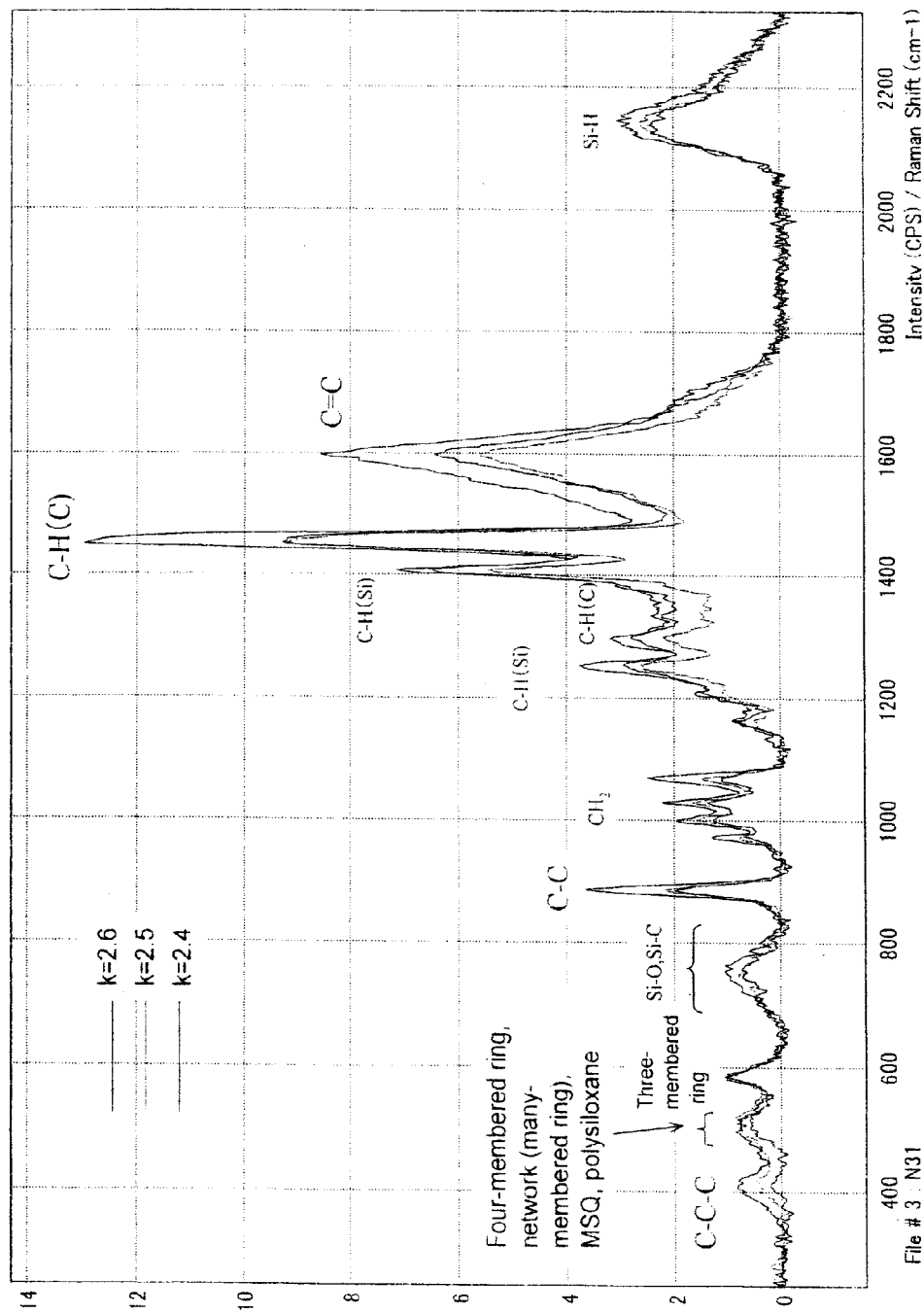
FIG. 1 is a chart showing a Raman spectrum of a film of a three-membered cyclic type SiOCH.
Figure 2:
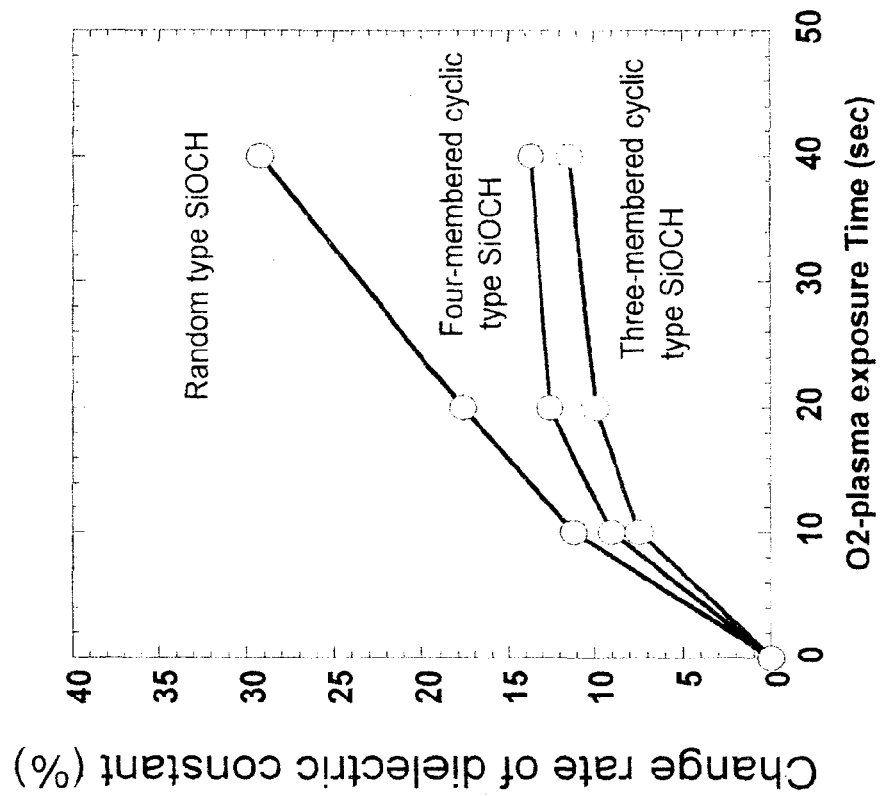
FIG. 2 is a chart showing the change of the dielectric constant of an insulating film according to an oxidation treatment period of time.

In the drawing, numerals have the following meanings. 113: silicon oxide film, 200: MOSFET, 201: semiconductor substrate, 202a and 202b: silicon oxide film, 210a and 210b: metal wiring, 211: insulative barrier film, 215: barrier metal film, 218a, 218b, 218c, 218d, 218e, 218f and 218g: SiCN film, 219a, 219b, 219c, 219d and 219e: cyclic type SiOCH film, 220a, 220b, 220c, 220d, 220e and 220f: CuAl, 221a, 221b, 221c, 221d, 221e and 221f: Ta/TaN, 222: TiN, 223: tungsten, 224: silicon nitride film, 225a and 225b: Ti/TiN, 226: AlCu, 310a and 310b: barrier metal film, 311a and 311b: metal wiring, 312a and 312b: insulative barrier film, 313, 313a and 313b: interlayer insulating film between vias, 314: interlayer insulating film between wirings, 315, 315a and 315b: hard mask film, 316: via hole, 317: hard mask groove, 318: dual damascene groove, 319, 319a, 319b, 319c, 319d and 319e: modified layer, 320a and 320b: etch-stop film, 321: organic film, 322: low-temperature oxide film, 323: ARC, and 324: photoresist.

BEST MODE FOR CARRYING OUT THE INVENTION

Before the present invention will be described in detail, the meaning of the terms in the present application will now be described below.

"Insulating film with low dielectric constant" means a film which isolates, for instance, wiring materials from each other (interlayer insulating film) and is made of material having a dielectric constant lower than that of a silicon oxide film (dielectric constant of 4.2) so as to decrease the capacitance between multilayer wirings that connect semiconductor elements. Particularly, a porous insulating film includes, for instance, a material of which the dielectric constant is decreased by making a silicon oxide film porous, and materials of which the dielectric constants are decreased by making a HSQ (Hydrogen Silsesquioxane) film, SiOCH, SiOC (Black Diamond (Trade Mark), CORAL (Trade Mark) and Aurora (Trade Mark)), for instance) and the like porous. In order to further decrease the dielectric constants of these films, a technology of forming a film by using a raw material of a cyclic siloxane is being investigated.

"Siloxane structure" means a structure which is formed from at least a silicon atom, an oxygen atom and a carbon atom and the skeleton of the film is formed from these atoms, among compounds containing an Si—O bond. The structure may comprise a hydrogen atom other than the above atoms, though depending on the siloxane structure. The siloxane structure cannot form a skeleton as the siloxane structure when containing too many numbers of carbon atoms, so that the number of carbon atoms is preferably five times or less than that of silicon atoms, in the present invention.

"Cyclic siloxane" shows a cyclic structure which is formed of a plurality of units when Si—O is counted as one unit. For instance, three-membered ring means a hexagonal molecular structure formed of $(SiO)_3$. In addition, four-membered ring means an octagonal molecular structure formed of $(SiO)_4$.

"Cyclic organosiloxane" means a molecular structure comprising a hydrocarbon group in a side chain of the above described cyclic siloxane structure. Examples of the hydrocarbon group include a methyl group, an ethyl group, a propyl group, an isopropyl group and a vinyl group.

Such a cyclic siloxane raw material is effective in forming a porous insulating film, but the insulating film is not necessarily limited to the porous film, in the present invention. Here, the composition of the insulating film is expressed by a ratio of the number of atoms which are included in unit volume.

"plasma vapor-deposition method" is a technique of continuously supplying a gaseous raw material to a reaction chamber under a reduced pressure, making molecules excited by plasma energy, and forming a continuous film on a substrate through a gas phase reaction, a substrate surface reaction or the like. There is also a case where a method of improving the reactivity of a monomer by previously introducing a side chain such as a vinyl group having high reactivity into a molecule of the raw material is referred to as a plasma polymerization method.

"Damascene wiring" means an embedded wiring which is formed by embedding metal wiring in a groove of an interlayer insulating film between wirings which has been previously formed, and removing a surplus other metal than the inner part of the groove with a CMP process, for instance. When the damascene wiring is formed by using Cu, a wiring structure is generally employed in which the side face and the periphery of the Cu wiring are covered with a barrier metal and the top face of the Cu wiring is covered with an insulative barrier film.

"Metal wiring" is mainly formed from Cu. In order to enhance the reliability of the metal wiring, the member made from Cu may include a metal element other than Cu and may also have a metal element other than Cu formed on the top face, a side face or the like.

"CMP (Chemical Mechanical Polishing) process" is a process for making an unevenness of a wafer surface caused in a process of forming a multilayer wiring contact a polishing pad which is rotated, while flowing a polishing liquid on the wafer surface to polish and thereby flatten the wafer surface. This CMP process is used particularly for removing a surplus metal portion after the metal has been embedded in a wiring groove or a via hole in a wiring-forming process by using a damascene method, and for obtaining a flat wiring surface.

"Barrier metal" means an electroconductive film which has barrier properties and covers the side face and the bottom face of the wiring so as to prevent the metal element comprising the wiring from diffusing into the interlayer insulating film or the lower layer. When the wire is formed from metal elements of which the main component is Cu, for instance, refractory metals and a nitride thereof such as tantalum (Ta), tantalum nitride (TaN), titanium nitride (TiN), titan (WTi) and carbonitriding tungsten (WCN) or a stacked film thereof are used.

"Insulative barrier film" means a film which is formed on the top face of Cu wiring, and has a function of preventing Cu from being oxidized and preventing Cu from diffusing into an insulating film and plays a role of an etch-stop layer when the Cu wiring is worked. For instance, an SiC film, an SiCN film and an SiN film are used as the insulative barrier film.

"Semiconductor substrate" is a substrate on which a semiconductor device is constructed, and includes not only a substrate which is formed on a single crystal silicon substrate but also an SOI (Silicon on Insulator) substrate and a substrate for manufacturing a TFT (Thin film transistor) liquid crystal, in particular.

"Hard mask" means an insulating film that is stacked on an interlayer insulating film and plays a role of protecting the interlayer insulating film comprising a lowered dielectric constant, when it is difficult to directly perform CMP for the interlayer insulating film, because the strength of the interlayer insulating film is deteriorated due to the lowered dielectric constant.

"Passivation film" expresses a film which is formed on the top layer of a semiconductor element and plays a role of protecting the semiconductor element from the external moisture or the like. In the present invention, a silicon oxynitride film (SiON) which has been formed by a plasma CVD process, a polyimide film or the like is used.

"Resist poisoning" is a phenomenon in which a chemical amplifier of the resist is deactivated by an amine-based component occluded in the inner part of an insulating film with a low dielectric constant or an interface between these insulating films, which causes a patterning failure.

"PVD (Physical Vapor Deposition) process" can employ a normal sputtering technique. In order to improve embedding properties and film quality and uniformize film thickness within a wafer plane, for instance, a sputtering technique having high directivity such as a long-throw sputtering technique, a collimate sputtering technique and an ionized sputtering technique can be used. Furthermore, a deposited metal film can be formed as an alloy film through previously preparing a metal target that contains another metal than a main component in an amount of the solid solubility limit or less and forming the metal film when sputtering the alloy. In the present invention, the above method can be used mainly when forming a Cu seed layer which is used for forming a damascene Cu wiring, or forming a barrier metal layer.

"TDDB (Time Dependent Dielectric Breakdown) lifetime" is a technique for predicting a period of time for the insulating film to cause breakdown, by using an accelerated test. When the TDDB lifetime of the insulating film between wirings is measured, for instance, the superiority and inferiority of the TDDB lifetime can be compared by using TEG (Test Element Group) having a comb shape, applying a comparatively high electric field of approximately 1 to 4 MV/cm between the wirings on a measurement condition of a predetermined temperature (for instance, 125° C.), monitoring a leakage current flowing between the wirings, and measuring a period of time from the time when the application of the electric field has been started to the time when the breakdown occurs.

"m-ELT test" is an abbreviation of a modified Edge Liftoff Test, and includes the steps of applying an epoxy layer to a sample, subjecting the sample to curing treatment at approximately 120° C., and then cooling the sample. Then, the residual stress in the epoxy layer caused by cooling applies peeling strength to the end face of each layer of the sample and forms a peeled portion. This peeled portion is detected by image processing, and a temperature at the time is recorded. Here, in this m-ELT test, the energy released when the layer of the sample is peeled is assumed to be approximately equal to an elastic energy stored in the epoxy layer. On the other hand, the residual stress value of the epoxy layer can be estimated from the temperature when the layer of the sample is peeled. Then, a stress strength (peeling strength) which is applied to a test thin film is calculated. The test method uses such a technique. It can be judged that the layer has more excellent adhesiveness as the stress value obtained when the layer has been peeled in this m-ELT test is larger.

As described above, "siloxane structure" can be analyzed with Raman analysis.

"Thickness of modified layer" can be measured with an XPS (X-ray Photoelectron Spectroscopy) analysis in a depth direction.

"Density of modified layer" can be measured with XRR (X-Ray Reflection: measurement of reflectance by X-Ray).

As will be described later in FIG. 6, a modified layer and the inner part of a first insulating film can be distinguished from each other by TEM-EELS analysis. Furthermore, the composition (ratio of number of atoms) in the inner part of the first insulating film and the modified layer per unit volume can be analyzed by the TEM-EELS analysis.

The semiconductor device according to the present invention may have a modified layer formed in at least one of an interface between a first insulating film and a metal and an interface between the first insulating film and a second insulating film. The first insulating film and the second insulating film may be sequentially formed, or may be formed through a clear interface. Furthermore, the second insulating film may contain a siloxane structure containing silicon, oxygen and carbon, and the modified layer may be formed in an interface between the second insulating film and the metal.

In the semiconductor device according to the present invention, a hard mask, an interlayer insulating film between vias and an interlayer insulating film between wirings can be the first insulating film or not depending on the case.

The present invention will now be described in detail below, with reference to exemplary embodiments and examples.

(Exemplary Embodiment 1)

In Exemplary embodiment 1, an insulating film with a low dielectric constant, which is suitable for an interlayer insulating film and formed by supplying a raw material of a cyclic organosiloxane to a reaction chamber. A preferable modified layer is formed on a portion of an insulating film containing the cyclic siloxane structure to be an interface between the insulating film and metal wiring, with a plasma vapor-deposition method, and thereby can decrease the capacitance between wirings and secure the insulation reliability at the same time.

A multilayer wiring structure on a semiconductor substrate comprising a semiconductor element formed thereon according to the exemplary embodiment will now be described below in detail.

Figure 3:
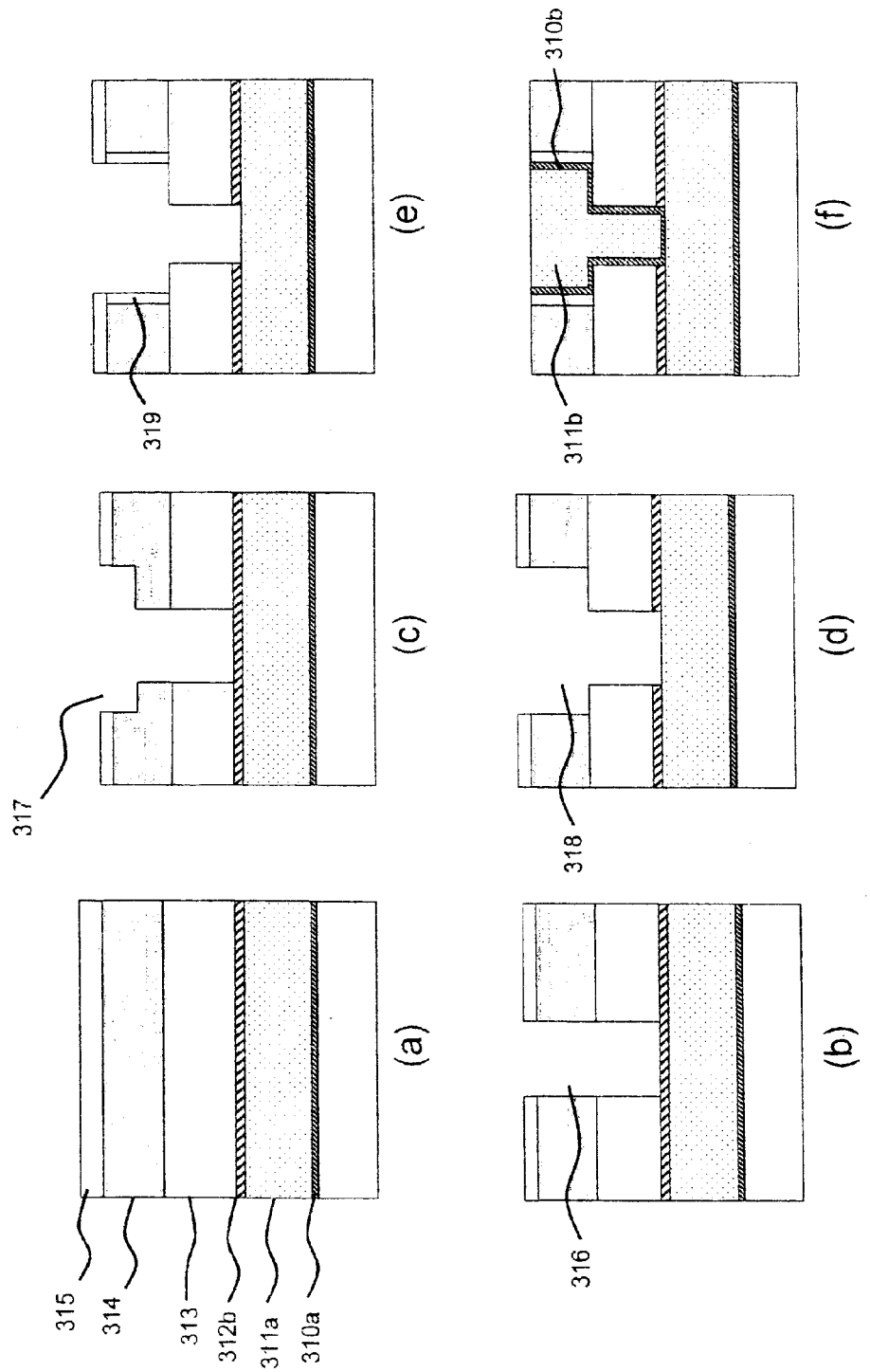
FIG. 3 is a view illustrating an example of manufacturing a semiconductor device according to Exemplary embodiment 1 of the present invention.

In the semiconductor device according to Exemplary embodiment 1, barrier metal 310a, metal wiring 311a and insulative barrier film 312b are stacked on a semiconductor substrate (not shown) comprising a semiconductor element formed thereon, and interlayer insulating film between vias 313, interlayer insulating film between wirings 314 and hard mask film 315 are formed thereon, as is illustrated in FIG. 3(a). Here, in the exemplary embodiment, a first insulating film is interlayer insulating film between wirings 314, and a second insulating film is interlayer insulating film between vias 313.

The metal wiring is made from Cu which is a main component, may contain another metal element than Cu so as to improve the reliability of metal wiring, and may have another metal element than Cu formed on the top face and a side face of Cu. This metal wiring can be formed with a sputtering process or a CVD process by using a Cu target, alternatively with an electrolytic plating process by using the Cu film formed by those methods as an electrode, or the like.

It is also effective to add at least one metal selected from the group consisting of aluminum, tin, titanium, tungsten, silver, zirconium, indium and magnesium, as another metal element than the main component. Furthermore, it is also effective to insert another metal than Cu such as tungsten (W), or a compound such as CoWP in between Cu wiring and an insulative barrier film, as an adhesion layer. Here, the insulative barrier film is formed of an SiN film, an SiCN film, an SiC film or the like, has the film thickness of 200 to 500 Å and is formed with a plasma CVD process.

Here, the barrier metal can be formed by using a sputtering process, a CVD process, an ALCVD (Atomic Layer Chemical Vapor Deposition) process or the like. For instance, the barrier metal can employ a refractory metal and a nitride thereof such as tantalum (Ta), tantalum nitride (TaN), titanium nitride (TiN), titan (WTi), nitriding titan (WTiN) and carbonitriding tungsten (WCN), or a stacked film thereof. Particularly, the stacked film of Ta/TaN (=upper layer/lower layer) is preferably used as the barrier metal.

Here, interlayer insulating film between vias 313 is an insulating film containing at least silicon, oxygen, carbon and hydrogen, and preferably has the film thickness of about 1,000 to 3,000 Å and a dielectric constant of 3.0 or smaller. Interlayer insulating film between vias 313 may be an insulating film which contains a cyclic siloxane structure containing at least silicon, oxygen, carbon and hydrogen.

Interlayer insulating film between vias 313 includes, for instance: an HSQ (Hydrogen Silsesquioxane) film (Type12 (Trade Mark), for instance); an MSQ (Methyl Silsesquioxane) film (JSR-LKD (Trade Mark), ALCAP (Trade Mark), NCS (Trade Mark), IPS (Trade Mark) and HOSP (Trade Mark), for instance); an organic polymer film (SiLK (Trade Mark) and Flare (Trade Mark)); and SiOCH, SiOC (Black Diamond (Trade Mark), CORAL (Trade Mark), AuroraULK (Trade Mark), Orion (Trade Mark), for instance) and an insulating film of the above compounds containing an organic substance. In addition, the typical examples of the interlayer insulating film between the vias include a film comprising a plurality of these insulating films stacked therein, and a film in which the composition or the density of these insulating films are changed in a film thickness direction.

Here, interlayer insulating film between wirings 314 is an insulating film with a low dielectric constant using a raw material of a cyclic organosiloxane containing at least silicon, oxygen, carbon and hydrogen. Interlayer insulating film between wirings 314 preferably has the film thickness of approximately 500 to 2,000 Å. Interlayer insulating film between wirings 314 may insert a layer having superior adhesiveness therein by changing a partial pressure of the raw material while plasma is excited. Furthermore, the interlayer insulating film may comprise an SiOCH layer or the like inserted to the upper part, which contains little carbon and may be exposed when Cu is subjected to CMP treatment.

When interlayer insulating film between wirings 314 contains a cyclic organosiloxane therein, the interlayer insulating film employs a raw material of a siloxane structure formed of a three-membered ring or a four-membered ring. In this case, the interlayer insulating film can be formed by using an inert carrier gas including He, Ar, Ne, Xe and Rn, supplying these raw materials to a reaction chamber, and applying a high-frequency power to the raw material. In Exemplary embodiment 1, interlayer insulating film between wirings 314 was formed by using the three-membered cyclic organosiloxane expressed by Formula (1).

Here, the hard mask film can employ $SiO_2$, SiON, SiC, SiCN or the like, and preferably has a film thickness of approximately 500 to 2,000 Å. Raw materials for forming these hard mask films include $SiH_4$, TEOS, trimethylsilane and a compound thereof added with an oxidation gas.

Subsequently, via hole 316 is formed in interlayer insulating film between vias 313, interlayer insulating film between wirings 314 and hard mask 315, through patterning with the use of a photoresist and dry etching, as is illustrated in FIG. 3(b).

Subsequently, wiring groove 317 is formed in hard mask 315 through transcription by using a photoresist pattern and a dry etching technique, as is illustrated in FIG. 3(c). At this time, the photoresist can be removed efficiently and completely by using an $O_2$ plasma ashing technique in a process of ashing the photoresist. At this point, interlayer insulating film between wirings 314 is not etched, so that a side wall of the wiring groove which will be formed later is not exposed to $O_2$ plasma.

Subsequently, wiring groove 318 is formed in interlayer insulating film between wirings 314 with a dry etching technique by using hard mask film 315 as a mask, as is illustrated in FIG. 3(d). The dry etching process used at this time for interlayer insulating film between wirings will now be described below in detail.

The interlayer insulating film can be etched by using, for instance, a mixture gas of tetrafluorocarbon ($CF_4$), argon (Ar), nitrogen ($N_2$) and oxygen ($O_2$) mixed in an arbitrary ratio as an etching gas, and using a parallel plate type of a dry etching apparatus. Specifically, the insulating film can be etched by using the parallel plate type of the etching apparatus for an 8-inch sample under conditions that the gas flow rate of $Ar/N_2/CF_4/O_2$ is 300/100/25/6 sccm, the distance between substrates (GAP) is 35 mm, the pressure is 50 mTorr, the frequency of an upper electrode is 60 MHz, a power of the upper electrode is 1,000 W, the frequency of a lower electrode is 13.56 MHz and the power of the lower electrode is 100 W.

Because hard mask 315 is used as the mask for etching at this time, the process shows an advantage of being capable of improving roughness in the line edge of the groove in comparison with the process of using the photoresist as a mask for working.

Subsequently, modified layer 319 is formed by oxidizing the side wall after having been etched, as is illustrated in FIG. 3(e). At this point, a photoresist for patterning a groove has been completely removed, so that the side wall can be modified on conditions preferable for modification.

At this time, the preferable modification condition can be an oxidation treatment with the use of $O_2$ plasma. A treatment period of time depends on a plasma condition, but is preferably about 5 to 15 seconds. Excessive oxidation treatment is not preferable because of promoting the oxidation of the side wall in the groove.

A parallel plate type of an in-situ ashing apparatus is used for irradiation with $O_2$ plasma. The treatment can be performed by using only oxygen gas for 5 seconds on specific conditions that the distance between substrates (GAP) is 30 mm, the pressure is 10 mTorr, the frequency of an upper electrode is 60 MHz, the power of the upper electrode is 600 W, the frequency of a lower electrode is 13.56 MHz and the power of the lower electrode is 100 W.

A mixture gas of $O_2$/Ar or the like may be used as a gas system to be used for irradiation with $O_2$ plasma. Treatment conditions to be employed for irradiation with plasma in this case can include conditions that the parallel plate type of the in-situ ashing apparatus is used, the gas flow rate of $O_2$/Ar is 200/300 sccm, the distance between substrates (GAP) is 40 mm, the pressure is 20 mTorr, the frequency of an upper electrode is 60 MHz, the power of the upper electrode is 500 W, the frequency of a lower electrode is 13.56 MHz, the power of the lower electrode is 100 W, only oxygen gas is used, and a treatment period of time is 5 seconds.

Here, another oxidation treatment method to be employed may include UV treatment with the use of ozone, and annealing treatment with the use of oxygen gas.

In the exemplary embodiment, a modified layer is formed on only the side wall of interlayer insulating film between wirings 314 as a typical example, which is illustrated in the figure, but the modified layer may be formed on another portion than the above portion as well. The modified layer may be formed, for instance, on an interlayer insulating film between vias in the bottom of the groove, the side wall of a via hole, and the like, as well.

In Exemplary embodiment 1, an insulating film containing a siloxane structure is used as interlayer insulating film between wirings 314, so that the modified layer formed on the side wall of the groove has high density and is formed so thin as 20 nm or less. In contrast, when an insulating film which is different from the above one and does not contain the siloxane structure is used for interlayer insulating film between wirings 314, a modified layer as thick as 30 to 50 nm is formed. From this result, it is understood that in order to impart a low dielectric constant and high insulation properties to a first insulating film, the first insulating film according to the present invention is preferably applied to interlayer insulating film between wirings 314.

When the modified layer is thus formed on an interface at which the first insulating film is connected to metal wiring, the modified layer can improve the adhesiveness between the metal wiring and the interlayer insulating film between the wirings. The reason is because the adhesiveness of a barrier metal to the modified layer is improved in comparison with a structure comprising no modified layer. The reason is because the modified layer has a composition containing a larger number of oxygen atoms than the number of carbon atoms per unit volume and improves the adhesiveness of itself to the barrier metal. By the way, because the modified layer is formed in the above described way, the modified layer does not contain fluorine.

By the way, the oxidation treatment is performed in a state in which Cu under the interlayer insulating film between the vias is exposed. At this time, the oxidation of Cu under the interlayer insulating film between the vias may be concerned. In this case, the method can also be employed which includes performing the oxidation treatment in a state in which an insulative barrier film in the bottom of the interlayer insulating film between the vias is not opened, and then opening the insulative barrier film with an etchback technique.

Subsequently, a dual damascene wiring is formed by embedding barrier metal 310b and metal wiring 311b in a dual damascene groove, and removing a surplus wire with a CMP process, as is illustrated in FIG. 3(f).

Figure 4:
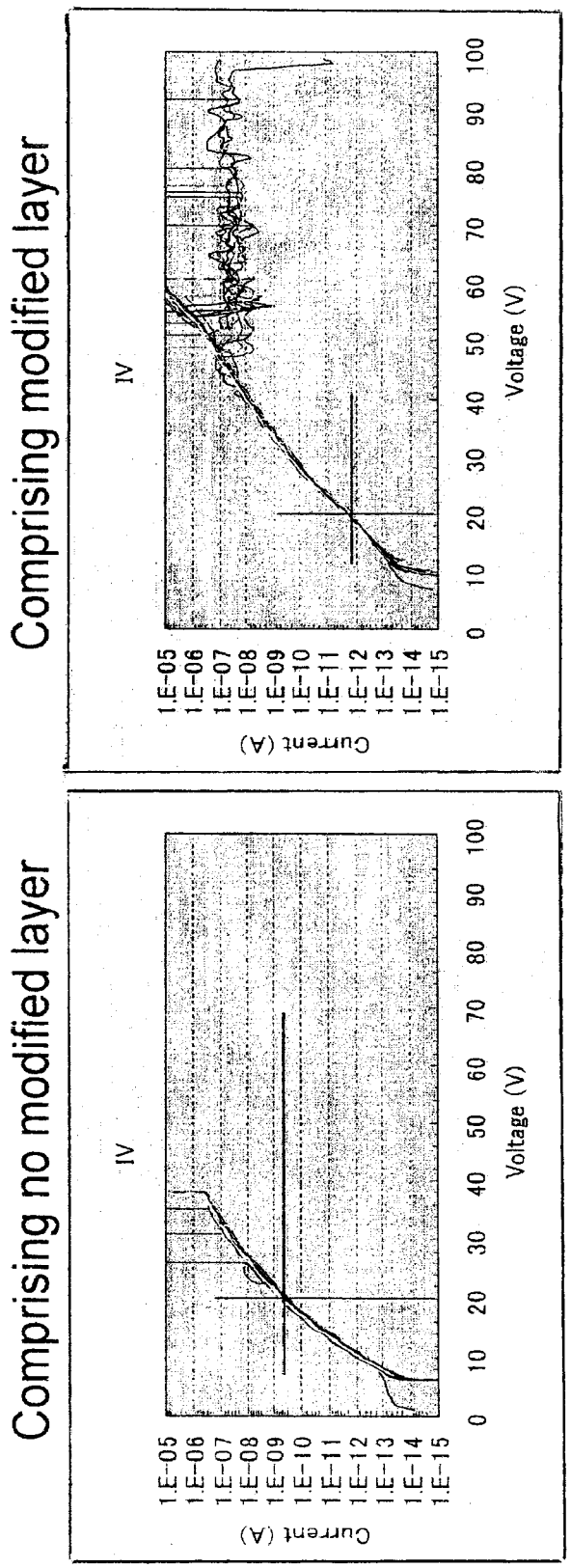
FIG. 4 is a view showing a comparison result of a leakage current between wires in semiconductor devices comprising a modified layer and comprising no modified layer.

FIG. 4 shows a result of having compared a leakage current between wirings in a multilayer wiring comprising a modified layer (FIG. 4(b); comprising modified layer), which has been prepared in the above way, with that in a multilayer wiring comprising no modified layer (FIG. 4(a); comprising no modified layer). Specifically, the leakage current between the wirings was compared at a room temperature through using the TEG having the line/space of minus 100 nm to 100 nm and the facing length of 5 cm. From the result of FIG. 4, it is understood that the leakage current between the wirings in the multilayer wiring "comprising a modified layer" can be decreased by approximately three digits compared to that in the multilayer wiring "comprising no modified layer".

Figure 5:
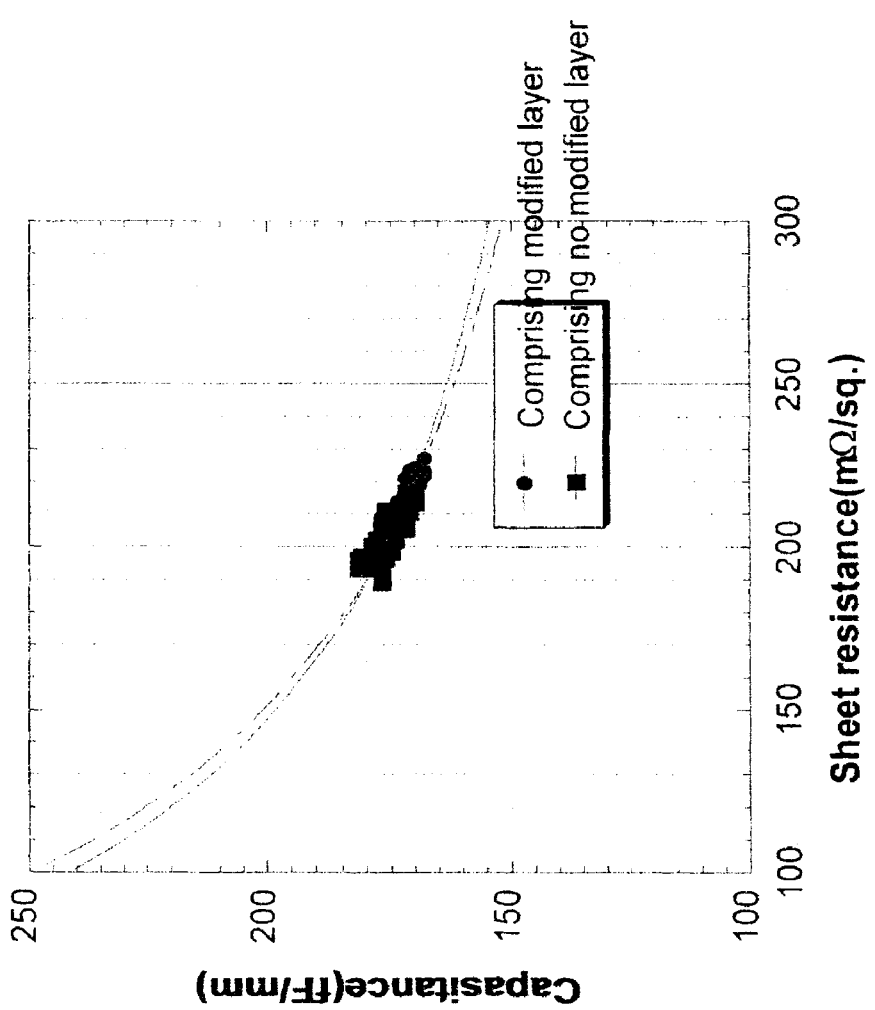
FIG. 5 is a chart showing a plot (R-C plot) of the wiring resistance and wiring capacitance in semiconductor devices comprising a modified layer and comprising no modified layer.

In order to compare the performance of the wiring at the time, a plot (R-C plot) of the wiring resistance and wiring capacitance is shown in FIG. 5. According to FIG. 5, it is understood that R-C plots of the wirings comprising a modified layer and comprising no modified layer are approximately equal, and accordingly the wirings have equivalent performance regardless of the presence or absence of the modified layer. In other words, it is understood that the leakage current can be necessarily decreased by using a cyclic type SiOCH film comprising a larger number of carbon atoms than the number of silicon atoms as a raw material, and the insulation reliability can be secured while maintaining the performance of the wiring by forming the modified layer according to the present invention.

Figure 6:
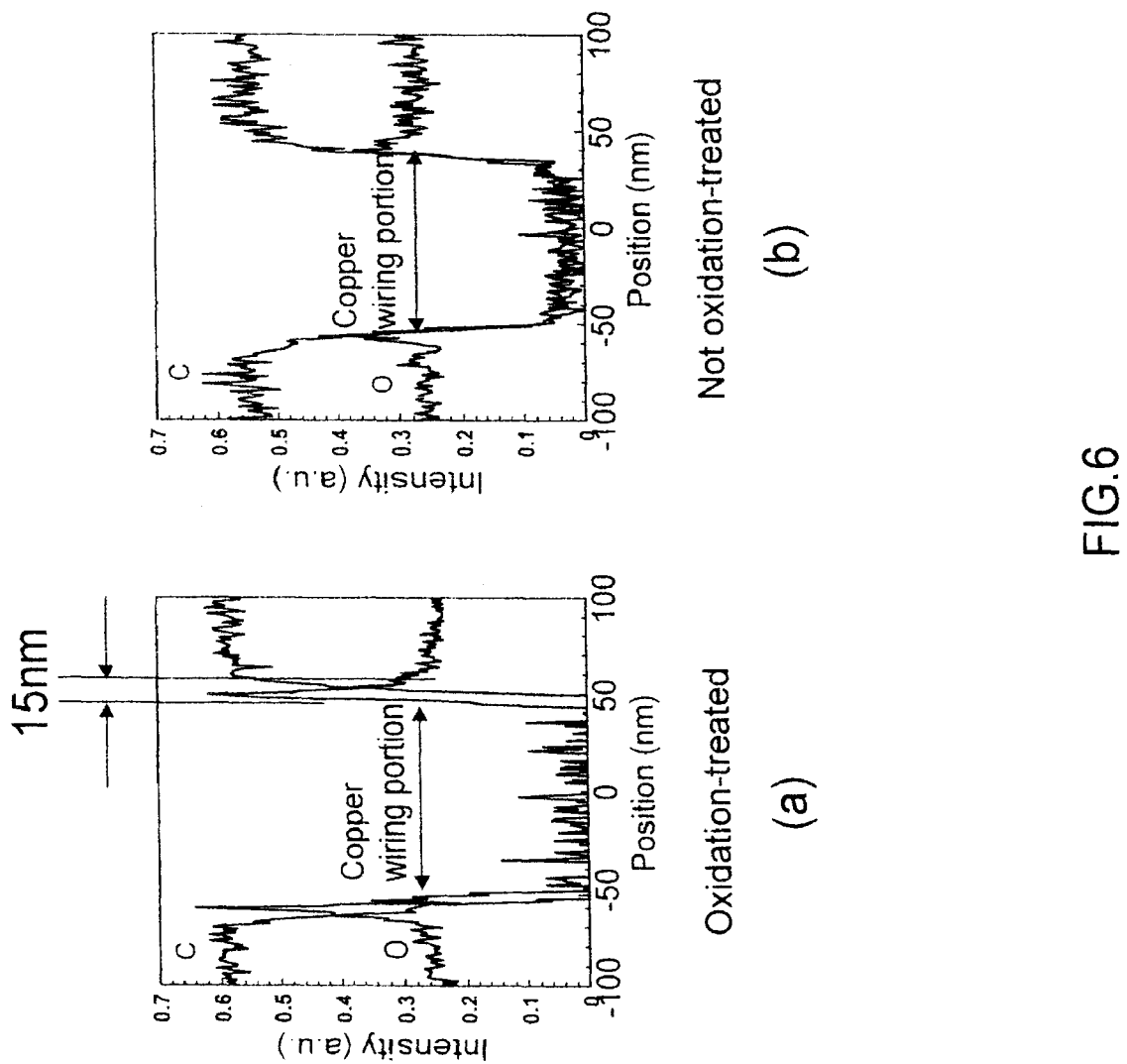
FIG. 6 is a chart showing a result of a composition analysis on semiconductor devices of Exemplary embodiment 1 and a sample comprising no modified layer with the use of TEM-EELS.

FIG. 6 shows the result of carrying out a composition analysis on a space between wires of the multilayer wiring which has been prepared in this way, by using TEM-EELS (Transmission Electron Microscop-Electron Energy Loss Spectroscopy).

This TEM-EELS can detect many elements from Li, B to $3d$ elements including Cu. A composition of a modified layer formed in an interface between a first insulating film and a wiring metal or in an interface between the first insulating film and a second insulating film can be confirmed by forming an element map on a TEM cross section from an EELS spectrum which is released from a sample. In the exemplary embodiment, an electric field type emission electron microscope (made in JEOL, JEM2100F) EELS:GATAN GIF "Tri-diem" was used as the TEM-EELS measuring apparatus. The analysis was performed by using a spectrum imaging method in a STEM (scanning TEM) mode on the measurement conditions that the accelerating voltage was 200 kV, the sample absorption current was 10 to 9 A and the beam spot size was 1 nm$\phi$.

FIG. 6 is a sectional view of the TEG having the line/space of minus 100 nm to 100 nm. A peak having an increasing intensity (a.u.) of O is recognized in the position of 50 nm and −50 nm in FIG. 6(a) (comprising modified layer), whereas such a peak is not recognized in the position of 50 nm and minus 50 nm in FIG. 6(b) (comprising no modified layer). From this result, it is understood that when the modified layer is formed, the modified layer having the thickness of approximately 15 nm is formed on the side wall.

In addition, the modified layer was formed on the surface of an interlayer insulating film between the wirings, by forming the interlayer insulating film between the wirings on a silicon substrate and subjecting the interlayer insulating film to a pseudo oxidation treatment, and was evaluated by using XRR (X-Ray Reflection: measurement of reflectance by X-Ray). As a result, it was confirmed that the modified layer had the density of 2.0 g/cm$^3$ or higher.

The inner part of the interlayer insulating film between the wirings employed at this time was an insulating film which contained a cyclic siloxane structure containing at least silicon, oxygen and carbon, and it was found from the result of TEM-EELS that the insulating film contained a twice or more amount of carbon atoms therein than that of oxygen atoms per unit volume. On the other hand, it was found from the result of TEM-EELS that the rate of the carbon atom amount to the oxygen atom amount was reversed in the modified layer in Exemplary embodiment 1.

Accordingly, it is understood that the interlayer insulating film can lower its dielectric constant and enhance its insulation reliability at the same time, by employing the method for manufacturing a semiconductor device and the semiconductor device according to the present invention. It is understood that the interlayer insulating film acquires high adhesiveness at the same time, which eventually enhances the performance of wiring, and enables LSI operatable with a high speed and a low electric power to be formed with a high degree of reliability.

Figure 7:
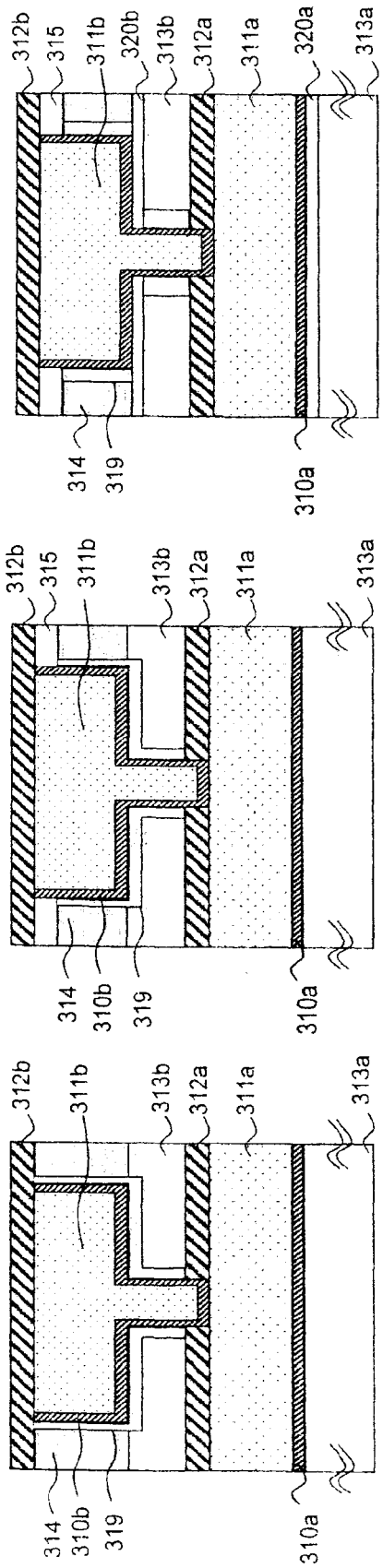
FIG. 7 is a view illustrating each modified example of a structure of dual damascene wiring according to Exemplary embodiment 1.
Figure 8:
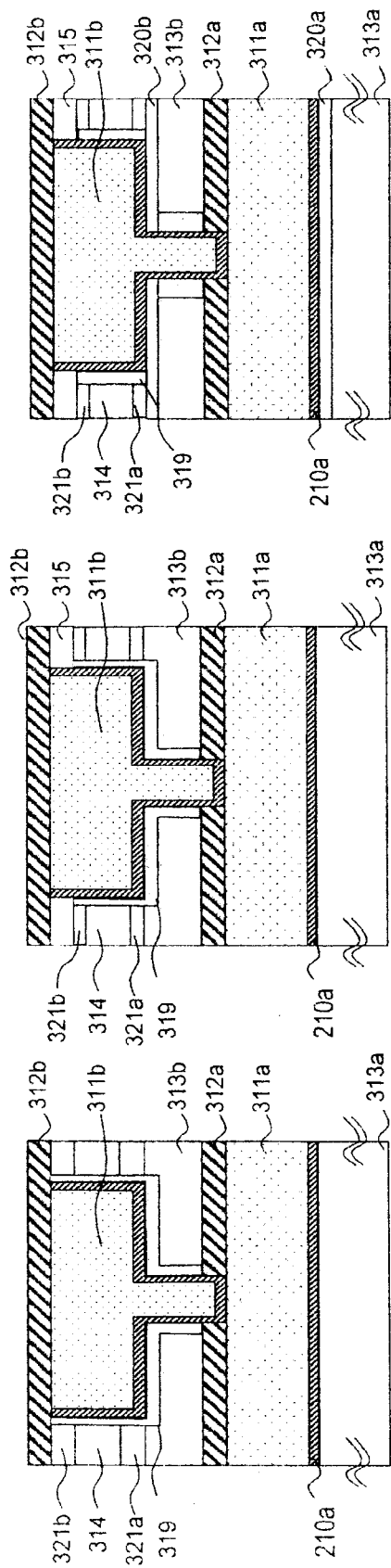
FIG. 8 is a view illustrating each modified example of a structure of dual damascene wiring according to Exemplary embodiment 1.
Figure 9:
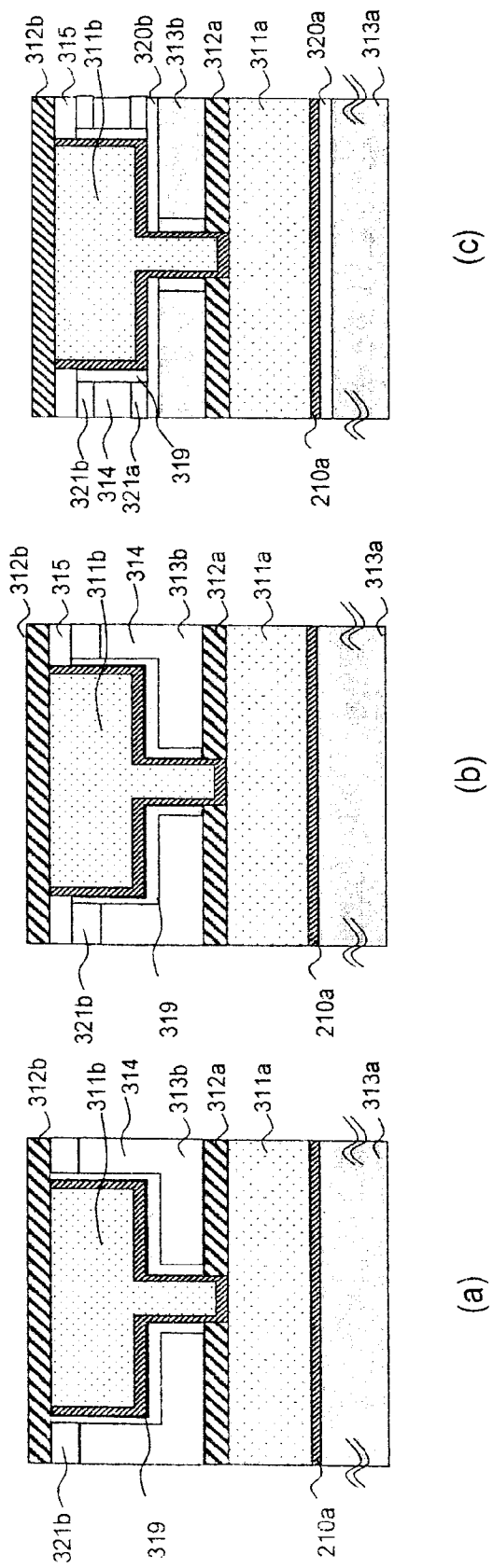
FIG. 9 is a view illustrating each modified example of a structure of dual damascene wiring according to Exemplary embodiment 1.

One example of a structure of a dual damascene wiring which has been formed in this way is illustrated in FIGS. 7 to 9. As is illustrated in FIG. 7(a), a lower layer metal wiring is formed of Ta/TaN barrier metal 310a and CuAl wire 311a. CuAl wire 311a contains Cu as a main component, and 1.2 atm % or less Al in the inner part. The top face of the lower layer metal wiring is covered with insulative barrier film 312a. Here, an SiCN film is used as an insulative barrier film, which has the dielectric constant of 4.9 and is formed with a plasma CVD process.

Aurora-ULK (Trade Mark) or Black Diamond (Trade Mark) which have been formed with a plasma CVD process is used for interlayer insulating films between vias 313a and 313b. A film of a cyclic type SiOCH with the dielectric constant of 2.37 is used as interlayer insulating film between wirings 314, of which the formation method has been described in Exemplary embodiment 1.

An upper layer wiring material is formed of Ta/TaN barrier metal 310b and CuAl wire 311b, similarly to the lower layer wiring material. This Ta/TaN barrier metal is formed with a PVD process. CuAl wire 311b contains Cu as a main component, and 1.2 atm % or less Al in the inner part.

The top face of the upper layer metal wiring is covered with insulative barrier film 312b. Here, an SiCN film was used as insulative barrier film 312b, which had the dielectric constant of 4.9 and was formed with a plasma CVD process. Modified layer 319 is formed on the side wall of a groove, and is formed so that the periphery is surrounded by the metal wiring.

FIG. 7(b) illustrates a structure in which hard mask film 315 for protecting the surface of an interlayer insulating film between wirings in a Cu-CMP operation is further inserted to the structure of FIG. 7(a). The hard mask film includes a silicon oxide film, a silicon carbide film and a silicon carbonitride film, and preferably has a higher dielectric constant and more excellent mechanical strength than those of interlayer insulating film between wirings 214. For this reason, an SiOCH film having the dielectric constant of about 3.0 or the like may be used as hard mask film 315. A structure other than the above structure is omitted because of being the same as in FIG. 7(a).

FIG. 7(c) illustrates a structure in which etch-stop films 320a and 320b are further inserted to the structure in FIG. 7(b). The etch-stop film is a film provided for improving the workability of a wiring groove having a dual damascene shape and a via hole, and by using such an etch-stop film, the distribution of the depth of the wiring groove can be reduced.

Here, it is acceptable for the etch-stop film to appropriately change the material according to the material to be worked. For instance, the etch-stop film can employ at least one of an SiO$_2$ film, an SiN film, an SiC film, an SiCN film, an SiOC film, an SiOCH film, a film containing an organic substance in these films, a film containing an organic substance as a main component, and a film containing the organic substance as a main component and SiO.

FIG. 8(a) illustrates a structure in which adhesion layers 321a and 321b that have been formed by using the partial pressure dependency of a cyclic organosiloxane raw material are further inserted into interlayer insulating film between wirings 314 in the structure of FIG. 7(a). The adhesion layer is an insulating film which is formed of a layer containing a little hydrocarbon component formed in a low partial pressure condition and contains silicon, oxygen, carbon and hydrogen, and preferably has a film thickness of approximately 500 to 3,000 Å and a dielectric constant of 3.0 or less. Interlayer insulating film between wirings 314 is an insulating film which contains a siloxane structure containing at least silicon, oxygen, carbon and hydrogen and has a low dielectric constant.

FIG. 8(b) illustrates a structure in which hard mask film 315 for protecting the surface of the interlayer insulating film between the wirings in a Cu-CMP operation is further inserted into the structure in FIG. 8(a). The hard mask film includes a silicon oxide film, a silicon carbide film and a silicon carbonitride film, and preferably has a higher dielectric constant and more excellent mechanical strength than those of interlayer insulating film between wirings 314. For this reason, an SiOCH film having the dielectric constant of about 3.0 or the like may be used as hard mask film 315. A structure other than the above structure is omitted because of being the same as in FIG. 8(a).

FIG. 8(c) illustrates a structure in which etch-stop films 320a and 320b are further inserted into the structure in FIG. 8(b). The etch-stop film is a film provided for improving the workability of a wiring groove having a dual damascene shape and a via hole. Here, it is acceptable for the etch-stop film to appropriately change the material according to the material to be worked, and can employ at least one of an SiO$_2$ film, an SiN film, an SiC film and an SiCN film, for instance.

FIG. 9(a) illustrates a structure in which interlayer insulating films between vias 313a and 313b are an SiOCH film containing at least silicon, oxygen, carbon and hydrogen, and interlayer insulating film between vias 313b and interlayer insulating film between wirings 314 are formed so as to be continuous. For instance, interlayer insulating film between vias 313b is formed by changing a partial pressure of the raw material while plasma is excited and applying a low partial pressure condition, and interlayer insulating film between wirings 314 if formed by applying a high partial pressure condition. Thereby, interlayer insulating film between vias 313b and interlayer insulating film between wirings 314 can form a continuous structure as shown in FIG. 9(a).

The interlayer insulating film between the vias and the interlayer insulating film between the wirings are formed by employing two or more raw materials of a siloxane containing both of a side chain comprising 3 or more carbon atoms and a vinyl group and changing the ratio of the respective raw materials. Thereby, interlayer insulating films between vias 313a and 313b are formed into a film having the C/Si ratio of approximately 1.4 and the dielectric constant of 2.7, and the interlayer insulating film between the wirings is formed into a film having the C/Si ratio of approximately 2.9 and the dielectric constant of 2.4. In this case, the modified layer is formed so as to surround the periphery of the wiring except the top face.

In the case of this wiring structure, the interlayer insulating film between the wirings contains a large number of carbon atoms so as to have the lowest dielectric constant. Thus, the wiring structure is characterized in that both of the interlayer insulating film between the wirings and the interlayer insulating film between the vias are insulating films containing a siloxane structure containing at least silicon, oxygen and carbon, and the number of the carbon atoms in the insulating film decreases in order of interlayer insulating film between wirings 314 and interlayer insulating film between vias 313.

FIG. 9(b) illustrates a structure in which hard mask film 315 for protecting the surface of the interlayer insulating film between the wirings in a Cu-CMP operation is further inserted into the structure in FIG. 9(a). The hard mask film includes a silicon oxide film, a silicon carbide film and a silicon carbonitride film, and preferably has a higher dielectric constant and more excellent mechanical strength than those of interlayer insulating film between wirings 314. For this reason, an SiOCH film having the dielectric constant of about 3.0 or the like may be used as hard mask film 315.

The interlayer insulating film between the vias and the interlayer insulating film between the wirings and the hard mask film are formed by employing two or more raw materials of a siloxane containing both of a side chain comprising 3 or more carbon atoms and a vinyl group, and changing the ratio of the respective raw materials. Thereby, the interlayer insulating films between the vias 313 is formed into a film having the C/Si ratio of approximately 1.4 and the dielectric constant of 2.7, and the interlayer insulating film between the wirings is formed into a film having the C/Si ratio of approximately 2.9 and the dielectric constant of 2.4. An SiOCH film having the C/Si ratio of 1.2 and the dielectric constant of 3.0 can be formed as hard mask film 315. In this case, the modified layer is formed so as to surround the periphery of the wiring except the top face.

In the case of this wiring structure, the wiring structure is characterized in that any of the interlayer insulating film between the wirings, the interlayer insulating film between the vias and the hard mask film is an insulating film containing a siloxane structure containing at least silicon, oxygen and carbon, and the number of the carbon atoms in the insulating film decreases in order of interlayer insulating film between wirings 314, interlayer insulating film between vias 313 and hard mask film 315. A structure other than the above structure is omitted because of being the same as in FIG. 9(a).

FIG. 9 (c) illustrates a structure in which etch-stop films 320a and 320b are inserted to the structure in FIG. 9(b). The etch-stop film is a film provided for improving the workability of a wiring groove having a dual damascene shape and a via hole. Here, it is acceptable for the etch-stop film to appropriately change the material according to the material to be worked. For instance, the etch-stop film can employ at least one film of an SiO$_2$ film, an SiN film, an SiC film and an SiCN film.

By the way, the dual damascene structure was described in detail in the exemplary embodiment, but it is apparent that the present invention can be applied to a single damascene wiring as well.

(Exemplary Embodiment 2)

In the exemplary embodiment, an insulating film containing a cyclic siloxane structure is formed by supplying at least a raw material of a cyclic organosiloxane to a reaction chamber with a plasma vapor-deposition method. Then, a preferable modified layer is formed on this insulating film so that the adhesiveness between the insulating film and the metal wiring can be improved.

A multilayer wiring structure on a semiconductor substrate comprising a semiconductor element formed thereon according to Exemplary embodiment 2 will now be described in detail.

Figure 10:
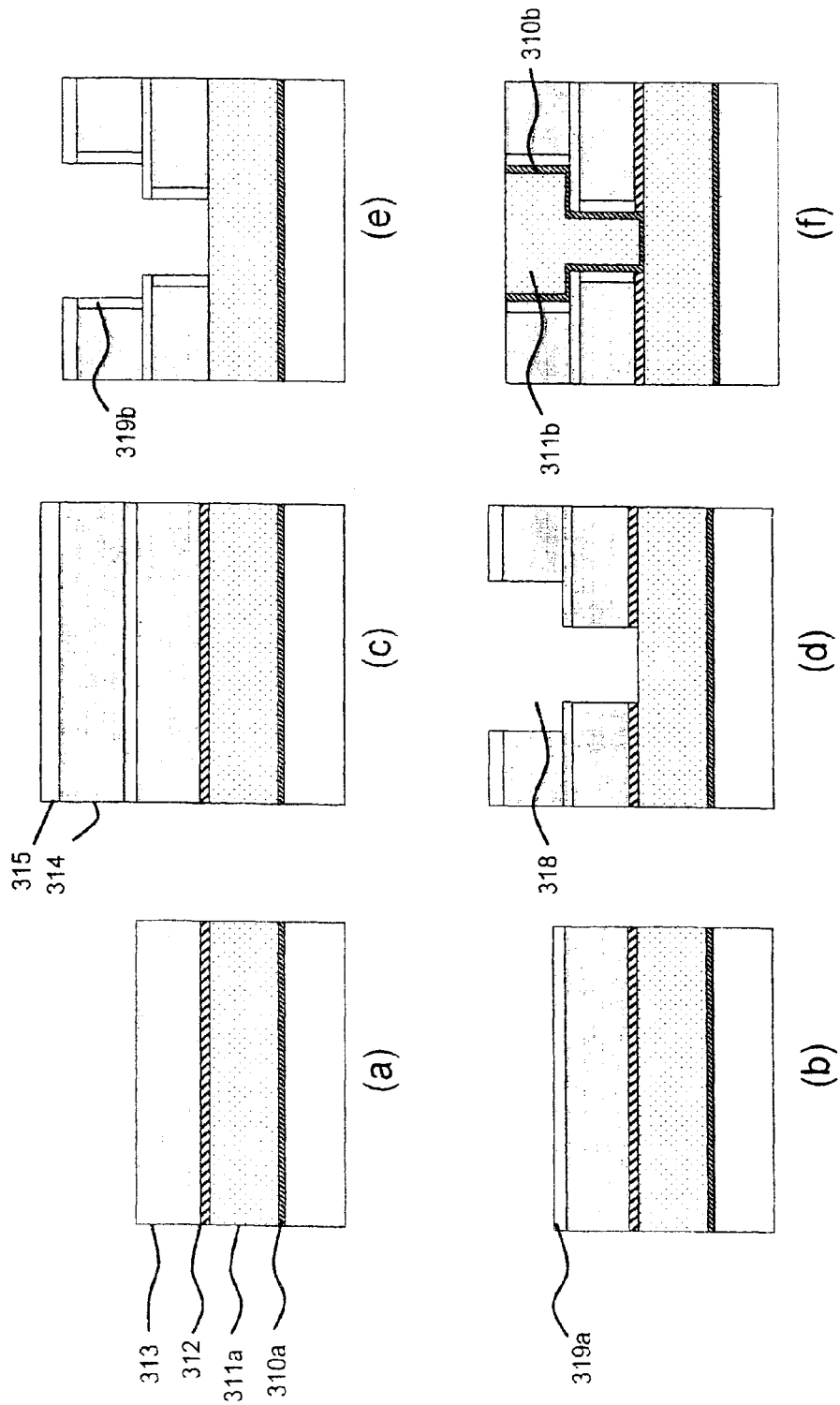
FIG. 10 is a view illustrating an example of manufacturing a semiconductor device according to Exemplary embodiment 2 of the present invention.

Barrier metal 310a, metal wiring 311a and insulative barrier film 312 are stacked on a semiconductor substrate (not shown) comprising semiconductor elements formed thereon, and interlayer insulating film between vias 313 is formed thereon, as is illustrated in FIG. 10(a).

Here, the barrier metal film, the metal wiring and the insulative barrier film are described in the same way as in Exemplary embodiment 1, so that the description will be omitted. Interlayer insulating film between vias 313 is an insulating film containing a cyclic organosiloxane structure containing at least silicon, oxygen, carbon and hydrogen.

Subsequently, modified layer 319a is formed by oxidizing the surface of interlayer insulating film between vias 313, as is illustrated in FIG. 10(b). At this time, it is acceptable to employ an O$_2$ plasma ashing process for the preferable oxidation treatment condition. An ashing duration of time is preferably approximately 5 to 15 seconds though depending on a plasma condition. Excessive oxidation treatment is not preferable because of promoting oxidation.

Specifically, interlayer insulating film between vias 313 is irradiated with O$_2$ plasma in a plasma CVD apparatus of a parallel plate type by using only oxygen gas for 5 seconds on conditions that the distance between substrates (GAP) is 10 mm, the pressure is 2.7 Torr, the frequency of an upper electrode is 13.56 MHz, and the power of the upper electrode is 200 W. A gas system for use in ashing with O$_2$ plasma may employ only O$_2$, or a mixture gas of a rare gas such as He, Ar, Ne, Xe and Rn mixed with O$_2$. An oxidation condition other than the above condition may employ the same method as the method described in Exemplary embodiment 1.

Subsequently, interlayer insulating film between wirings 314 and hard mask film 315 are formed on interlayer insulating film between vias 313 as is illustrated in FIG. 10(c). Here, interlayer insulating film between wirings 314 employs an insulating film containing a cyclic organosiloxane structure containing at least silicon, oxygen, carbon and hydrogen, and preferably has the film thickness of approximately 500 to 2,000 Å. A film having superior adhesiveness may be inserted in interlayer insulating film between wirings 314, by changing a partial pressure of the raw material, while plasma is excited. Furthermore, an SiOCH layer or the like which contains little carbon and may be exposed in a Cu-CMP operation may be inserted onto the upper part.

The interlayer insulating film between the wirings can be formed by using a siloxane comprising a structure formed of a three-membered ring or a four-membered ring as the cyclic organosiloxane, using an inert carrier gas including He, Ar, Ne, Xe and Rn, supplying the cyclic organosiloxane and the inert carrier gas to a reaction chamber, and applying a high-frequency power to electrodes. In Exemplary embodiment 2, interlayer insulating film between wirings 314 was formed by using the three-membered cyclic organosiloxane in Formula (1).

Here, the hard mask film can employ SiO$_2$, SiON, SiC, SiCN or the like, and preferably has a film thickness of 500 to 2,000 Å.

In Exemplary embodiment 2, a first insulating film is the interlayer insulating film between wirings 314, and a second insulating film is interlayer insulating film between vias 313. Modified layer 319a formed in the above described way can improve the adhesiveness between interlayer insulating film between vias 313 and interlayer insulating film between wirings 314.

Subsequently, dual damascene groove 318 is formed in interlayer insulating film between wirings 314 and interlayer insulating film between vias 313, by a patterning technique with the use of a photoresist and a dry etching technique, as is illustrated in FIG. 10(d). The etching condition employed at this time is omitted because of being the same as described in Exemplary embodiment 1, but modified layer 319a formed on the insulating film plays a role of an etch-stop layer, and can consequently decrease the variation of the depth of the wiring groove within a wafer plane.

Subsequently, modified layer 319b is formed on the side wall by oxidizing the side wall which has been already etched, as is illustrated in FIG. 10(e). At this point, a photoresist for patterning a groove is completely removed, so that the side wall can be oxidized on conditions preferable for modification.

Subsequently, a dual damascene wiring is formed by embedding barrier metal 310b and metal wiring 311b in the dual damascene groove and removing a surplus wire with a CMP process, as is illustrated in FIG. 10(f).

At this time, the inner part of interlayer insulating film between wirings 314 forms an insulating film which contains a cyclic siloxane structure containing at least silicon, oxygen and carbon. From the result of the TEM-EELS analysis, it was confirmed that modified layer 319a was formed on an interface between interlayer insulating film between wirings 314 and interlayer insulating film between vias 313, and modified layer 319b was formed on an interface between interlayer insulating film between wirings 314 and metal wiring 311b. It was also known that the amount of oxygen atoms in modified layers 319a and 319b was twice or more than that of carbon atoms per unit volume. In Exemplary embodiment 2, modified layers 319a and 319b had thicknesses of 20 nm or less.

It was also confirmed that the barrier metal showed an improved adhesiveness to the modified layer compared to a structure comprising no modified layer. This is considered to be because the modified layer enhanced the adhesiveness to the barrier metal because of having a composition containing more oxygen atoms than carbon atoms.

By employing the method for manufacturing a semiconductor device and the semiconductor device according to the present invention, the interlayer insulating film could lower its dielectric constant and enhance its insulation reliability at the same time; and acquired high adhesiveness at the same time, which eventually enhanced the performance of wiring, and enabled LSI operatable with a high speed and a low electric power to be formed with a high degree of reliability.

Figure 11:
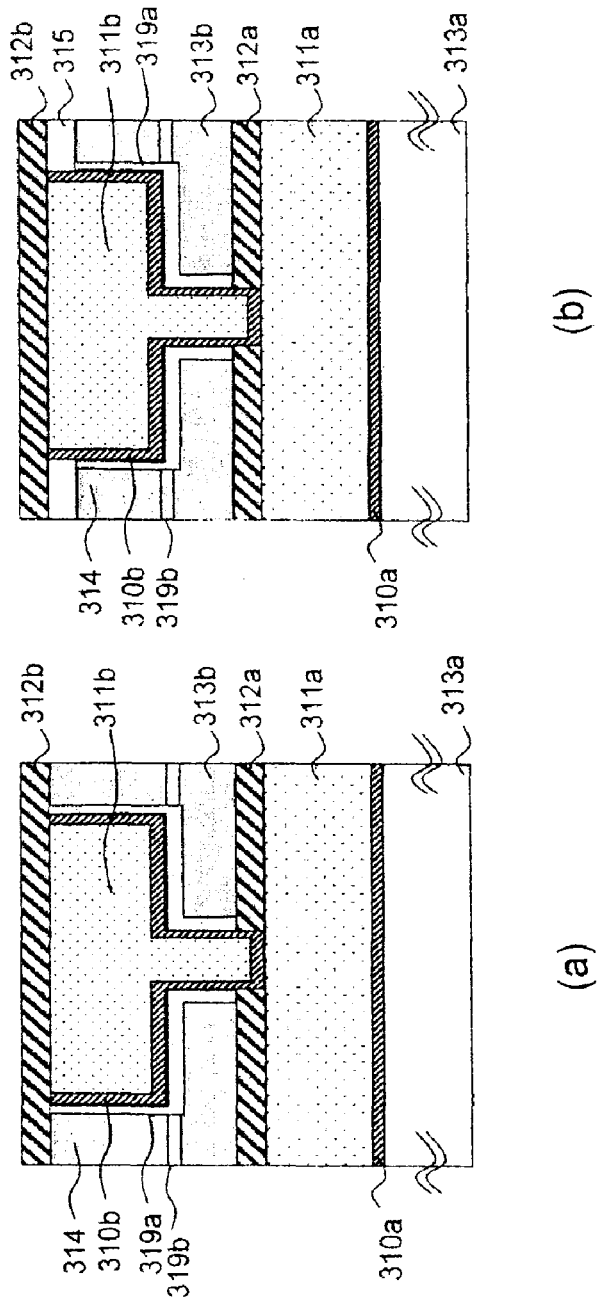
FIG. 11 is a view illustrating each modified example of a structure of dual damascene wiring according to Exemplary embodiment 2.
Figure 12:
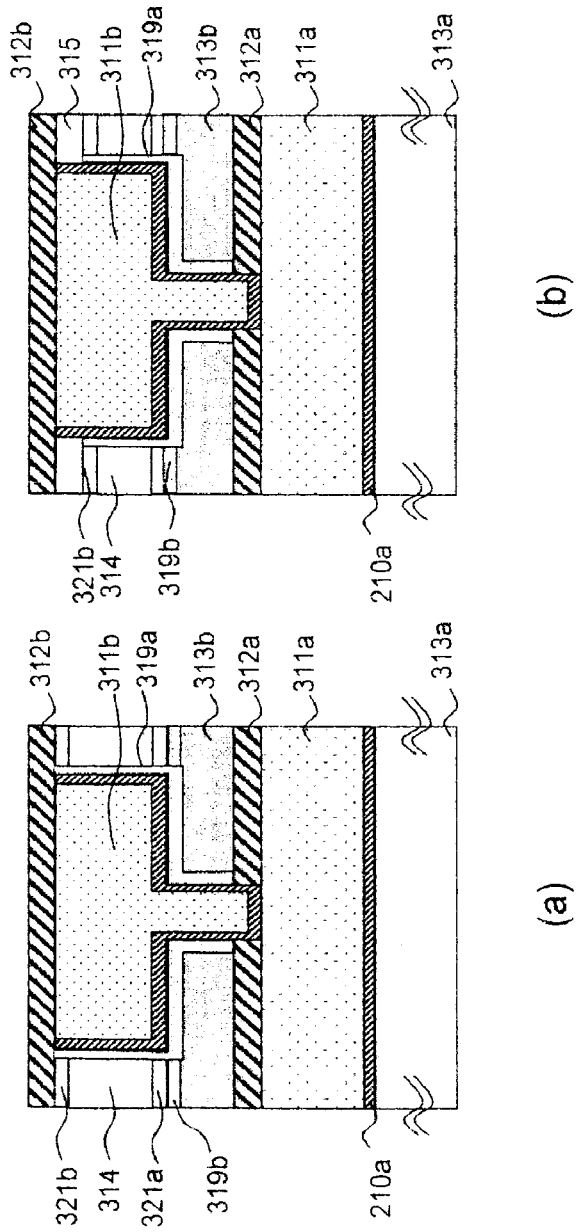
FIG. 12 is a view illustrating each modified example of a structure of dual damascene wiring according to Exemplary embodiment 2.

One example of a structure of a dual damascene wiring which has been formed in this way is illustrated in FIGS. 11 to 12.

As is illustrated in FIG. 11(a), a lower layer metal wiring is formed of Ta/TaN barrier metal 310a and CuAl wire 311a. CuAl wire 311a contains Cu as a main component, and 1.2 atm % or less Al in the inner part. The top face of the lower layer metal wiring is covered with insulative barrier film 312a. Here, an SiCN film is used for insulative barrier film 312a, which has been formed with a plasma CVD process and has the dielectric constant of 4.9.

Interlayer insulating films between vias 313a and 313b are insulating films containing a cyclic organosiloxane structure containing at least silicon, oxygen, carbon and hydrogen, and are films containing a siloxane structure formed of a three-membered ring or a four-membered ring. Here, a cyclic type SiOCH film is used for the interlayer insulating films, which is formed by using a siloxane structure expressed by Formula (1) as a raw material and has the dielectric constant of 2.37.

An upper layer wiring material is formed of Ta/TaN barrier metal 310b and CuAl wire 311b, similarly to a lower layer wiring material. The Ta/TaN barrier metal is formed with a PVD process. CuAl wire 311b contains Cu as a main component, and 1.2 atm % or less Al in the inner part.

The top face of the upper layer metal wiring is covered with insulative barrier film 312b. Here, an SiCN film is used for insulative barrier film 312b, which has been formed with a plasma CVD process and has the dielectric constant of 4.9. Modified layer 319a is formed on the side wall of the groove and the bottom of the groove, and modified layer 319b is formed on an interface between the interlayer insulating film between vias and an interlayer insulating film between wirings.

FIG. 11(b) illustrates a structure in which hard mask film 315 for protecting the surface of the interlayer insulating film between the wirings in a Cu-CMP operation is further inserted into the structure in FIG. 11(a). The hard mask film includes a silicon oxide film, a silicon carbide film and a silicon carbonitride film, and preferably has a higher dielectric constant and more excellent mechanical strength than those of interlayer insulating film between wirings 214. For this reason, an SiOCH film having the dielectric constant of about 3.0 or the like may be used as hard mask film 315. A structure other than the above structure is omitted because of being the same as in FIG. 11(a).

FIG. 12(a) illustrates a structure in which adhesion layers 321a and 321b that have been formed by using the partial pressure dependency of a cyclic organosiloxane raw material are further inserted into interlayer insulating film between wirings 314 in the structure of FIG. 11(a). The adhesion layer is an insulating film which is formed of a layer containing little hydrocarbon component formed in a low partial pressure condition and contains silicon, oxygen, carbon and hydrogen, and preferably has a film thickness of about 1,000 to 3,000 Å and a dielectric constant of 3.0 or less.

FIG. 12(b) illustrates a structure in which hard mask film 315 for protecting the surface of the interlayer insulating film between the wirings in a Cu-CMP operation is further inserted into the structure in FIG. 12(a). The hard mask film includes a silicon oxide film, a silicon carbide film and a silicon carbonitride film, and preferably has a higher dielectric constant and more excellent mechanical strength than those of interlayer insulating film between wirings 314. For this reason, an SiOCH film having the dielectric constant of about 3.0 or the like may be used as hard mask film 315. A structure other than the above structure is omitted because of being the same as in FIG. 12(a).

By employing the above described wiring structure, it becomes possible to compatibly decrease the capacitance between the wirings and improve insulation properties while improving the adhesiveness.

By the way, the dual damascene structure was described in detail in Exemplary embodiment 2, but it is apparent that the present invention can be applied to a single damascene wiring as well.

EXAMPLES

Example 1

Example will now be described below in detail, in which a multilayer wiring is formed on a semiconductor substrate comprising a semiconductor element formed thereon and the insulating film is modified with the use of oxygen plasma.

Figure 14:
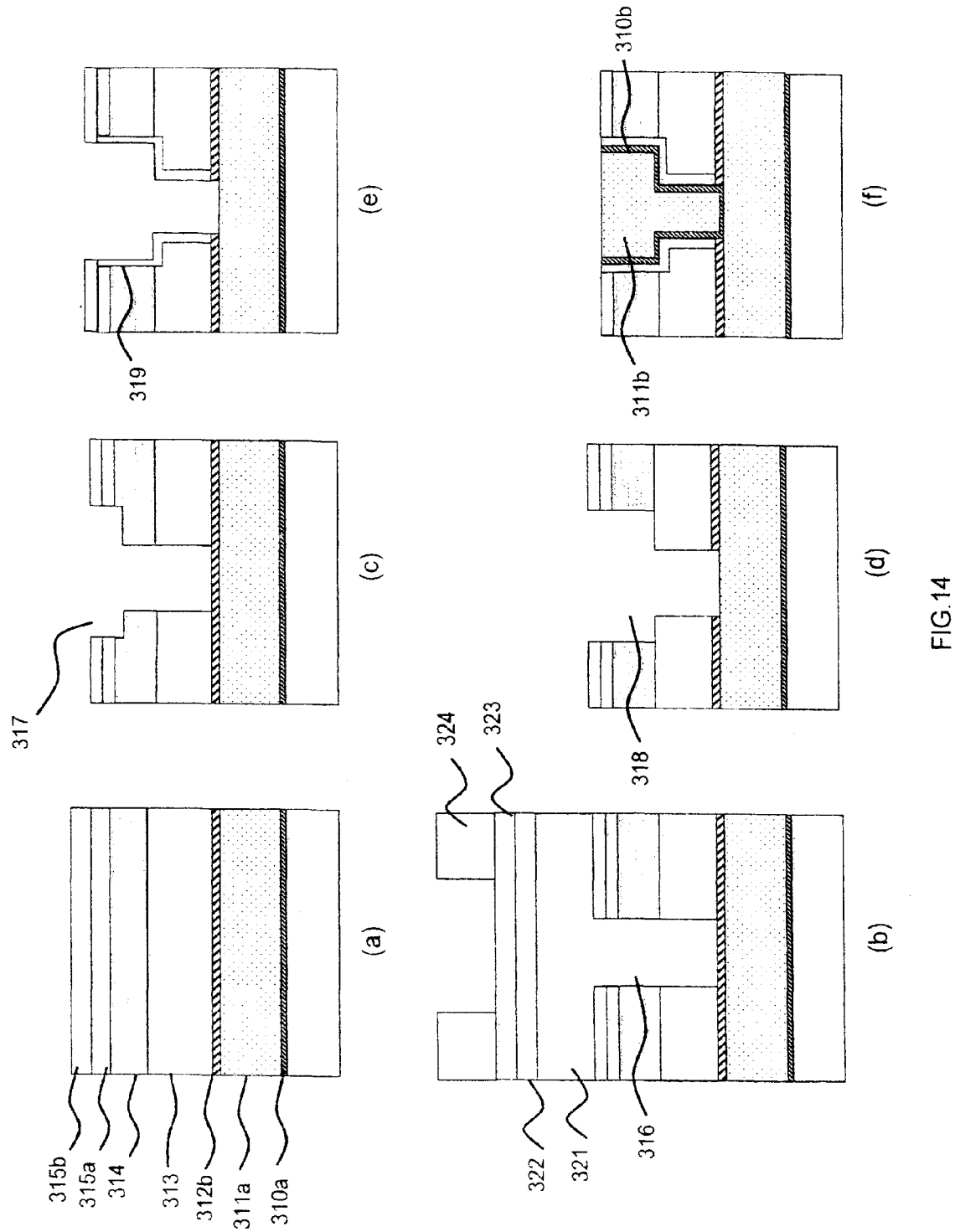
FIG. 14 is a view illustrating an example of manufacturing a semiconductor device according to Example 1 of the present invention.

Barrier metal 310a, metal wiring 311a and insulative barrier film 312b were stacked on a semiconductor substrate (not shown) comprising a semiconductor element formed thereon, as is illustrated in FIG. 14(a). Interlayer insulating film between vias 313, interlayer insulating film between wirings 314 and hard mask films 315a and 315b were formed on the upper part of insulative barrier film 312b. In the Example, a first insulating film is interlayer insulating film between wirings 314, and a second insulating film is interlayer insulating film between vias 313.

Here, barrier metal film 310a was formed in a form of a stacked film of Ta/TaN (=upper layer/lower layer) and into the thickness of 10/5 nm respectively, with a sputtering process. Metal wiring 311a was formed by forming a seed layer with a sputtering technique with the use of a CuAl(Al: 1.2 atm %) target and embedding Cu with an electrolytic plating process.

Insulative barrier film 312b was an SiCN film having the dielectric constant of 4.9 which was formed with a plasma CVD process, and had the thickness of 300 Å. Before insulative barrier film 312b was formed, the surface of Cu was irradiated with the plasma of $NH_3$ or with $SiH_4$ gas as reduction treatment.

Here, interlayer insulating film between vias 313 was an insulating film containing at least silicon, oxygen and carbon, and had the film thickness of 1,200 Å. As the material, AuroraULK (Trade Mark) having the dielectric constant of 2.8 and high strength was used. At this time, the interlayer insulating film between the vias had the composition of Si:O:C=1:0.8:0.7 per unit volume.

In addition to the above material, for instance, NCS (Trade Mark), IPS (Trade Mark), HOSP (Trade Mark), Black Diamond (Trade Mark) or CORAL (Trade Mark) may be used for interlayer insulating film between vias 313. When the interlayer insulating film between the vias is formed, a film-forming condition may be changed so as to have high strength, and processes such as a UV cure and an EB cure may be used.

Interlayer insulating film between wirings 314 was formed into the film thickness of 1,100 Å, by using a raw material containing a siloxane structure expressed by Formula (1) and He gas as a carrier in a plasma CVD process. At this time, interlayer insulating film between wirings 314 had the composition of Si:O:C=1:1:3 per unit volume. The adhesiveness having the thickness of 4 nm was inserted to the lower layer, by changing a partial pressure of the raw material, while plasma was excited. When interlayer insulating film between wirings 314 was formed, the partial pressure of the raw material was set at 50 Pa, though the partial pressure was set at 10 Pa when the adhesion layer was formed.

Hard mask film 315a was an insulating film containing at least silicon, oxygen and carbon, and was formed into the film thickness of 300 Å. In the Example, Black Diamond (Trade Mark) having the dielectric constant of 3.0 was used specifically as hard mask film 315a. Hard mask film 315a is not limited to Black Diamond. In addition to the above material, NCS (Trade Mark), IPS (Trade Mark), HOSP (Trade Mark), Black Diamond (Trade Mark), CORAL (Trade Mark) and AuroraULK (Trade Mark) may be used, for instance. When the hard mask film is formed, a film-forming condition may be changed so as to have high strength, and processes such as a UV cure and an EB cure may be used.

Hard mask film 315b was an $SiO_2$ film formed with a plasma CVD process, and was formed into the film thickness of 800 Å. Each of hard mask films 315a and 315b was irradiated with plasma of He so as to make the adhesiveness to the lower layer film improved. At this time, the hard mask film was irradiated with the plasma of He by using a parallel plate type of a plasma CVD apparatus for an 8-inch sample for 50 seconds on conditions that He was flowed at 600 sccm, the distance between substrates (GAP) was 10 mm, the pressure was 3.0 Torr, the frequency of an upper electrode was 13.56 MHz and the power of a lower electrode was 250 W. Though having not been described particularly, the insulating films may be subjected to plasma treatment with the use of an inert gas appropriately as needed so as to improve the adhesiveness between the insulating films.

Subsequently, a via hole was formed in interlayer insulating film between vias 313, the interlayer insulating film between wirings 314 and hard mask films 315a and 315b, by a patterning technique with the use of a photoresist and a dry etching technique. Subsequently, the via hole was cleaned through an organic cleaning process, and then was subjected to heat treatment at 300° C. for 1 minute. The reason is because the heat treatment removes organic/amine components taken into the insulating film and mitigates a deterioration of an embedded organic film and resist poisoning.

Subsequently, the organic film of 5,000 Å was embedded in the via hole, and was once flattened by an etchback. Then, organic film 321 was applied again into the thickness of 2,500 Å, and was subjected to curing treatment at 300° C. for one minute, as is illustrated in FIG. 14(b). Low-temperature oxide film 322 was formed thereon. At this time, low-temperature oxide film 322 was formed with a plasma CVD process, and the temperature of the substrate in the process was set at 200° C. or lower. Subsequently, antireflection coating (ARC) 323 and photoresist 324 were formed thereon. Thus formed structure can avoid the resist poisoning when a photoresist for ArF is used.

Subsequently, wiring groove 317 was formed in hard mask 315 by a patterning technique with the use of a photoresist and a dry etching technique, as is illustrated in FIG. 14(c). At this time, photoresist 324 and the like were removed completely through an ashing process with the use of $O_2$ plasma. At this point, interlayer insulating film between wirings 314 is not etched, so that a side wall of the wiring groove which will be formed later is not exposed to $O_2$ plasma.

Subsequently, wiring groove 318 was formed in interlayer insulating film between wirings 314 with a dry etching technique while using hard mask film 315 as a mask, as is illustrated in FIG. 14(d). A method for dry-etching the interlayer insulating film between the wirings at this time included using the parallel plate type of the etching apparatus for an 8-inch sample, and setting the gas flow rate of $Ar/N_2/CF_4/O_2$ at 300/100/25/6 sccm, the distance between substrates (GAP) at 35 mm, the pressure at 50 mTorr, the frequency of an upper electrode at 60 MHz, the power of the upper electrode at 1,000 W, the frequency of a lower electrode at 13.56 MHz and the power of the lower electrode at 100 W.

Subsequently, modified layer 319 was formed on the side wall by oxidizing the side wall which had been already etched, as is illustrated in FIG. 14(e). At this time, the side wall was oxidized by irradiation with $O_2$ plasma. The side wall was treated for 5 seconds by using a parallel plate type in-situ ashing apparatus and only oxygen gas, on conditions in which the distance between substrates (GAP) was 30 mm, the pressure was 10 mTorr, the frequency of an upper electrode was 60 MHz, the power of the upper electrode was 600 W, the frequency of a lower electrode was 13.56 MHz, and the power of the lower electrode was 100 W.

At this time, since the insulating film containing a cyclic siloxane was used as interlayer insulating film between wirings 314, it was confirmed that the modified layer formed on the side wall of the groove had high density and the thickness of about 10 nm by TEM-EELS. It was also confirmed that the modified layer had a smaller number of carbon atoms and a larger number of oxygen atoms per unit volume than interlayer insulating film between wirings 314. On the other hand, it was confirmed that a modified layer with the thickness of about 40 nm was formed on the side wall of interlayer insulating film between vias 313 in the bottom part of the wiring groove.

Subsequently, a dual damascene wiring was formed by embedding barrier metal 310b and metal wiring 311b in a dual damascene groove, and removing a surplus wire with a CMP process, as is illustrated in FIG. 14(f).

Example 2

Example will now be described below in detail, in which a multilayer wiring is formed on a semiconductor substrate comprising a semiconductor element formed thereon and the insulating film is modified with the use of oxygen plasma.

Figure 15:
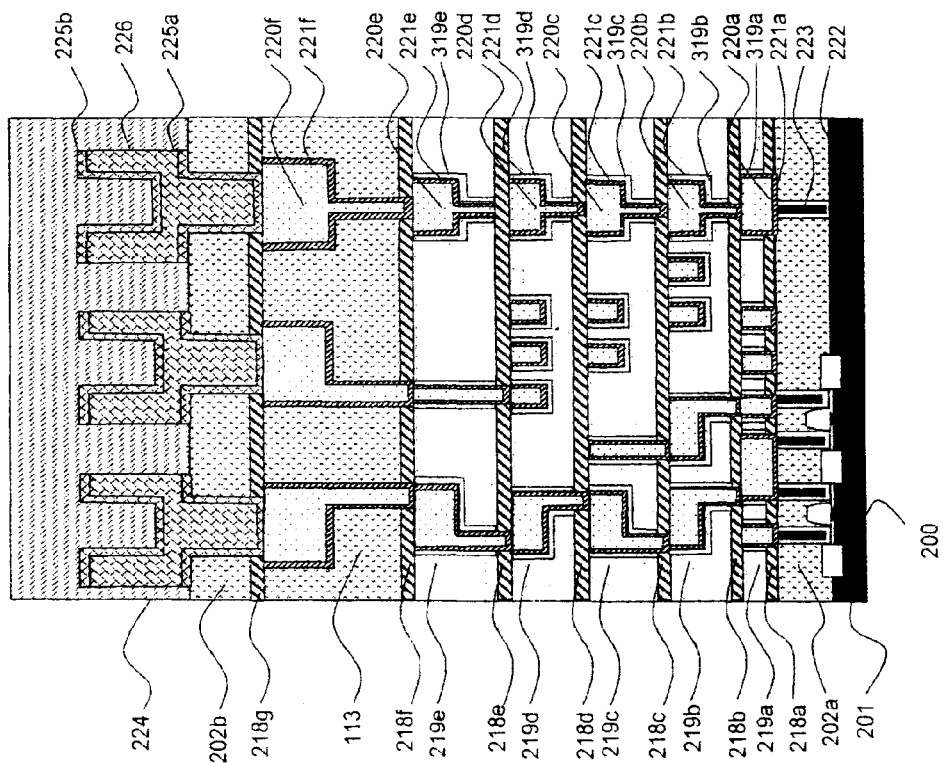
FIG. 15 is a view illustrating one example of a semiconductor device according to Example 2 of the present invention.

In this semiconductor device, barrier metal 221a, metal wiring 220a and insulative barrier film 218a are formed on a semiconductor substrate (not shown) comprising a semiconductor element formed thereon, and interlayer insulating film between wirings 219a is formed thereon, as is illustrated in FIG. 15. In the Example, a first insulating film and a second insulating film are integrated to form interlayer insulating films between wirings 219a to 219e.

Interlayer insulating film between wirings 219a contains a siloxane structure containing silicon, oxygen and carbon, and the siloxane structure has a larger number of carbon atoms than the number of silicon atoms. Furthermore, modified layer 319a having a smaller number of carbon atoms and a larger number of oxygen atoms per unit volume than the inner part of the interlayer insulating film between the wirings is formed in an interface with interlayer insulating film between wirings 219a contacting with the metal wiring, and is controlled so as to have a thickness of about 10 to 20 nm.

Here, the metal wiring material contains Cu as a main component. In order to enhance the reliability of the metal wiring material, the member made from Cu may include a metal element other than Cu and may also comprise a metal element other than Cu formed on the top face, the side face or the like of Cu. In the Example, Cu was formed with an electrolytic plating process, by using a Cu layer having a thickness of 400 Å formed with a PVD process as a seed layer. The Cu layer formed with the PVD process contains 1.2 atm % or less Al in the inner part.

Here, the insulative barrier film was formed of an SiCN film having a thickness of 300 Å, and was formed with a plasma CVD process. Interlayer insulating film between wirings 219a was a cyclic type SiOCH film formed by using a cyclic organosiloxane expressed by Formula (1) as a raw material with a plasma vapor-deposition method, had the dielectric constant of 2.4, and had the thickness of 2500 Å including that of a portion between vias. Metal wiring 220a and barrier metal 221a are embedded in a dual damascene groove formed of such an interlayer insulating film.

Here, the stacked film of Ta (15 nm)/TaN (5 nm) (=upper layer/lower layer) formed with a PVD process was used as barrier metal film 221a. The metal wiring member was formed by using a Cu target containing 1.2 atm % Al with a PVD process, and Cu was formed with a plating method.

As for the height of each wiring layer, M1 (in which the reference numeral of each component is (a)) to M5 (in which the reference numeral of each component is (e)) had thicknesses of 170 nm, and M6 (in which the reference numeral of each component is (f)) had a thickness of 300 nm.

In the semiconductor device illustrated in FIG. 15, barrier metals 221b to 221e have the same configurations as barrier metal 221a, and metal wirings 220b to 220e have the same configurations as metal wiring 220a. In addition, insulative barrier films 218b to 218e have the same configurations as insulative barrier film 218a, interlayer insulating films between wirings 219b to 219e have the same configurations as interlayer insulating film between wirings 219a, and modified layers 319b to 319e have the same configurations as modified layer 319a. For this reason, the descriptions will be omitted on barrier metals 221b to 221e, metal wirings 220b to 220e, insulative barrier films 218b to 218e, interlayer insulating films between wirings 219b to 219e and modified layers 319b to 319e.

Here, the semiconductor device may have a structure in which a hard mask film or the like is inserted so as to protect the surface of the interlayer insulating film between the wirings in a Cu-CMP operation. A silicon oxide film, a silicon carbide film, a silicon carbonitride film and the like can be used for the hard mask film and the hard mask film has preferably a higher dielectric constant and more excellent mechanical strength than those of the interlayer insulating film between wirings 213. For this reason, an SiOCH film having the dielectric constant of about 3.0 or the like may be used as the hard mask film.

Al was used for an upper layer wiring. Ti/TiN 225a, Al—Cu 226 and Ti/TiN 225b were formed with a PVD process. As for the thickness of each metal layer, the thickness of Ti/TiN 225 was about 0.3 μm, the thickness of Al—Cu 226 was 1.5 μm, and the thickness of Ti/TiN 225b was 0.3 μm. At this time, a metal was continuously embedded in the via hole having a groove shape. The upper layer was covered with a passivation film.

The above wiring structure having introduced a modified layer therein could make the capacitance between wirings compatible with the insulation reliability.

A TDDB test for the insulating film between wirings was conducted by using TEG of a comb shape having a space of 70 nm between wirings, and an electric field of 2.5 MV/cm at 125° C. was applied to the TEG. As a result, the insulation lifetime was 120 hours or longer. Thus, it was confirmed that the insulating film had sufficient TDDB resistance.

In addition, such a device was formed and a wafer was diced to make chips cut out. Then, the chips were mounted on ceramic packages, and the packages were sealed with a resin. This chips had a size of 25 mm×25 mm, and were subjected to a temperature cycle test of minus 65° C. to 150° C. till the cycle reaches 1,000. As a result, the semiconductor device of the Example showed such improved adhesiveness due to a modified layer that no peeling was observed in 50 chips. In contrast to this, the semiconductor device comprising no modified layer formed therein showed such inferior adhesiveness that 2 chip samples were confirmed to have caused some degree of peeling from the corner of the chip.

Incidentally, the dual damascene structure was described in detail in the Example, but it is apparent that the present invention can be applied to a single damascene wiring as well.

Example 3

Example will now be described below in detail, in which a multilayer wiring was formed on a semiconductor substrate comprising a semiconductor element formed thereon, and an insulating film was modified with the use of nitrogen plasma. A method for manufacturing a semiconductor device other than the modification condition will be omitted because of being the same as in Example 1. In Example 3, a first insulating film is interlayer insulating film between wirings 314, and a second insulating film is interlayer insulating film between vias 313.

At this time, the insulating film was modified by irradiation with $N_2$ plasma. In addition, the insulating film was treated for 5 seconds, by using a parallel plate type in-situ ashing apparatus and only nitrogen gas, and setting the distance between substrates (GAP) at 30 mm, the pressure at 10 mTorr, the frequency of an upper electrode at 60 MHz, the power of the upper electrode at 600 W, the frequency of a lower electrode at 13.56 MHz, and the power of the lower electrode at 100 W, as a condition at this time.

At this time, an insulating film containing a cyclic siloxane was used as interlayer insulating film between wirings 314, so that the modified layer of the side wall of a groove had high density. It was confirmed by TEM-EELS that the modified layer having a thickness of about 10 nm was formed. The modified layer had a composition of an SiOCN film which contained a smaller number of carbon atoms and a larger number of oxygen atoms per unit volume than interlayer insulating film between wirings 314. Accordingly, it can be judged that the carbon amount was decreased by the modification treatment with the use of $N_2$ plasma, and nitrogen substituted for carbon. Furthermore, a leakage current between wirings was measured. As a result, it was confirmed that the semiconductor device had a sufficiently low leakage current equivalent to that treated with oxygen plasma, which had been described in Example 1.

Comparative Example 1

A state of a side wall will now be described below in Comparative example 1, in the case where a semiconductor device has been formed by using a raw material of a straight-chain SiOCH expressed by Formula (3), with a plasma vapor-deposition method with the use of oxization plasma by using oxygen. In this semiconductor device, siloxane structures in the inner part of an interlayer insulating film between wirings and an interlayer insulating film between vias contain a nearly equal number of carbon atoms to the number of silicon atoms.

Figure 13:
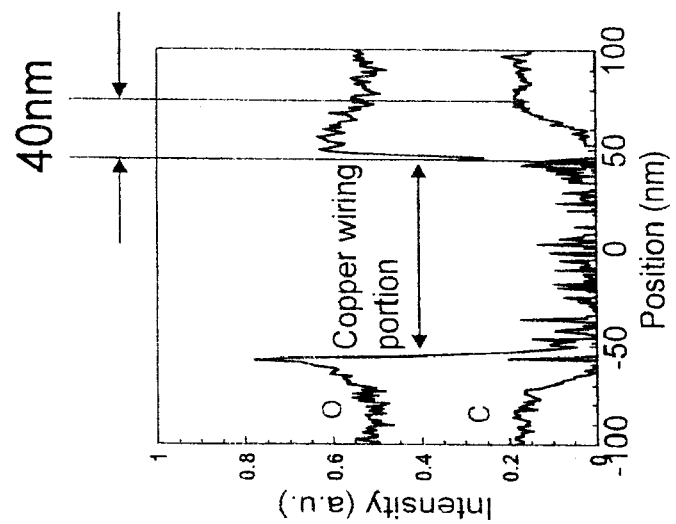
FIG. 13 is a chart showing a result of a composition analysis on a space between wires of a multilayer wiring in Comparative example 1 with the use of TEM-EELS.

FIG. 13 illustrates a chart showing a result of a composition analysis on a space between wires of a copper multilayer wiring formed on this straight-chain SiOCH film with the use of TEM-EELS. FIG. 13 illustrates a sectional view of a TEG having the line/space of minus 100 nm to 100 nm.

From the result in FIG. 13, it is understood that a modified layer with the thickness of about 40 nm is formed on the side wall, which is twice or more that of the modified layer according to the present invention. This is because carbon was rapidly released in the film, since the film did not contain a vinyl group and a hydrocarbon group comprising 3 or more carbon atoms therein. This is also because the film had a random Si—O structure, and accordingly, a dense modified layer with a nanometric level of thickness could not be formed. Furthermore, this is because a modified layer having high density would not be formed even though a preferable oxidation condition would have been selected, and consequently, the oxidation progressed into the inner part of the film.

The capacitance between the wirings was measured as described above. As a result, it was confirmed that the capacitance between the facing wirings increased by 5% in the line/space of minus 100 nm to 100 nm because the modified layer was formed into the thickness of 40 nm.

Referential Example 1

The result of the case will now be described below as Referential example 1, in which a modified layer was formed by using a mixture gas of $N_2/O_2/C_4F_8$ as an etching gas for a film of a cyclic type SiOCH.

Specifically, a wiring groove was formed by using a parallel plate type of an etching apparatus for an 8-inch sample on conditions that the gas flow rate of $N_2/O_2/C_4F_8$ was 150/30/8 sccm, the distance between substrates (GAP) was 45 mm, the pressure was 25 mTorr, the frequency of an upper electrode was 60 MHz, the power of the upper electrode was 1,000 W, the frequency of a lower electrode frequency was 13.56 MHz and the power of the lower electrode was 150 W.

The modified layer was formed in the wiring groove formed in this way by $O_2$ plasma, and the leakage current between the wirings was measured. As a result, an abnormal chip occurred, which showed a higher leakage current between the facing wirings in a range of line/space of minus 100 nm to 100 nm by about 10% in the plane. This is because the side wall of the groove was insufficiently modified due to the deposit formed in etching. That is to say, the reason was because the modified layer according to the present invention was not formed in the case. When the etching condition changes, a preferable modification condition changes. Accordingly, it is possible to cope with the circumstance by appropriately changing the modification condition.

Referential Example 2

An example will now be described below as Referential example 2, in which a wiring layer is formed through opening a wiring groove by using a groove resist as a mask as in Example 1, and through performing ashing treatment for the groove resist and modification treatment on the side wall of the groove with $O_2$ plasma at the same time.

The resist ashing treatment at this time was performed by irradiation with $O_2$ plasma. Specifically, the side wall was treated for 40 seconds by using a parallel plate type in-situ ashing apparatus and only oxygen gas, on conditions in which the distance between substrates (GAP) was 30 mm, the pressure was 10 mTorr, the frequency of an upper electrode was 60 MHz, the power of the upper electrode was 600 W, the frequency of a lower electrode was 13.56 MHz, and the power of the lower electrode was 100 W.

Specifically, in the Referential example, the side wall of the groove was excessively irradiated with oxygen plasma with an 8 times longer treatment period of time than Example 1, in order to convert the resist into ash at the same time.

The wiring prepared in the Referential example was compared to the wiring prepared in Exemplary embodiment 1. As a result, it was confirmed that the capacitance between the facing wirings in the line/space of minus 100 nm to 100 nm of the Referential example was 3% higher than that of Exemplary Example 1. From the above described result, the advantages of the present invention can be confirmed, which are caused by performing the resist ashing process and the oxidation treatment separately.

In addition, the present invention can be applied to anything that relates to a wiring structure of a multilayer wiring, which decreases capacitance between wirings, enhances insulation reliability at the same time and needs to improve the adhesiveness by forming a modified layer, and a manufacturing method therefor. The applicability to the range is not limited at all.

In the above, the present invention was described in association with some exemplary embodiments and Examples, but it can be understood that these exemplary embodiments and Examples are described for only illustrating the present invention with reference to examples, and do not limit the present invention.

For instance, the technology on the apparatus for manufacturing the semiconductor comprising a CMOS circuit was described in detail, which is an application filed existing in the background of the invention by the present inventors, but the present invention is not limited to the application filed. The present invention can be also applied, for instance, to a semiconductor device comprising a memory circuit such as DRAM (Dynamic Random Access Memory), SRAM (Static Random Access Memory), a flash memory, FRAM (Ferro Electric Random Access Memory), MRAM (Magnetic Random Access Memory) and a resistance-change type memory; and a semiconductor device comprising a logic circuit such as a micro processing unit; or an embedded-type semiconductor device comprising the above described circuits mounted thereon at the same time. The present invention can be also applied to a semiconductor device, an electronic circuit device, an optical circuit device, a quantum circuit device, a micromachine and the like as well comprising an embedded type alloy wiring structure on at least one part.

In addition, the modified layer according to the present invention can be confirmed from a finished product as well. Specifically, the composition of the modified layer in the interlayer film between the wirings can be confirmed by analyzing the interlayer insulating film in the periphery of the metal wiring with a TEM-EELS analysis. In addition, the composition of the modified layer can be confirmed similarly by analyzing an interface between an interlayer insulating film between vias and the interlayer insulating film between the wirings with the TEM-EELS analysis.

The apparatus for manufacturing the semiconductor according to the present invention includes, for instance; film-forming means which can form a film including a first insulating film, a second insulating film and a hard mask; a vacuum chamber in which the insulating film can be modified; etching means which can conduct etching treatment; photolithographic means which can conduct photolithography treatment; and controlling means which can control each step.

Here, this controlling means preferably includes a microcomputer which stores a program therein for controlling the steps of forming a groove, removing a photoresist and modifying an insulating film. The controlling means preferably further stores a program therein for forming a first insulating film by a plasma treatment sequence in the step of forming the insulating film. This plasma treatment sequence is preferably a sequence of an oxygen plasma treatment or a sequence of nitrogen plasma treatment.

After the specification has been read, it is apparent that a large number of changes and modifications can be easily conducted by equivalent components and technologies for those skilled in the art, but it is apparent that the changes and the modifications correspond to the true scope and spirit of the attached claims.

The invention claimed is:

1. A semiconductor device including a multilayer wiring comprising:
    a semiconductor substrate;
    an insulating film formed on the semiconductor substrate, at least one part of the insulating film being formed of a first insulating film and a second insulating film;
    a wiring groove and a via hole formed in the insulating film;
    a wire and a connecting plug formed from a metal respectively filled in the wiring groove and the via hole; and
    a modified layer formed on at least one of an interface between the first insulating film and the metal and an interface between the first insulating film and the second insulating film,
    wherein the first insulating film is at least one layer insulating film including a siloxane structure containing silicon, oxygen and carbon,
    the siloxane structure in the inner part of the first insulating film contains a larger number of carbon atoms than the number of silicon atoms, and
    the modified layer contains a smaller number of carbon atoms and a larger number of oxygen atoms per unit volume than the inner part of the first insulating film.

2. The semiconductor device according to claim 1, wherein the first insulating film containing the siloxane structure contains a larger number of carbon atoms than the number of oxygen atoms per unit volume in the inner part.

3. The semiconductor device according to claim 1, wherein the siloxane structure contains both of a hydrocarbon group including at least 3 carbon atoms and an unsaturated hydrocarbon group.

4. The semiconductor device according to claim 1, wherein the siloxane structure includes a cyclic siloxane structure containing an oxygen atom and a silicon atom.

5. The semiconductor device according to claim 4, wherein the cyclic siloxane structure is formed of a three-membered cyclic structure including three Si—O units each of which is formed of an oxygen atom and a silicon atom.

6. The semiconductor device according to claim 1, wherein the modified layer contains a larger number of oxygen atoms than the number of carbon atoms per unit volume.

7. The semiconductor device according to claim 1, wherein the modified layer contains a larger number of oxygen atoms and nitrogen atoms in total than the number of carbon atoms per unit volume.

8. The semiconductor device according to claim 1, wherein the modified layer has a thickness of 20 nm or less.

9. The semiconductor device according to claim 1, wherein the modified layer has a density of 2.0 g/cm$^3$ or larger.

10. The semiconductor device according to claim 1, wherein the first insulating film has the density of 1.2 g/cm$^3$ or smaller in the inner part.

11. The semiconductor device according to claim 1, wherein the first insulating film is formed of an interlayer insulating film between vias in a via plug portion, an interlayer insulating film between wirings in a wiring portion and a hard mask film in the wiring portion, which is sequentially stacked from a semiconductor substrate side,
any film of the hard mask film, the interlayer insulating film between the wirings and the interlayer insulating film between the vias is an insulating layer containing a siloxane structure containing silicon, oxygen and carbon,
the modified layers are formed on any of an interface between the hard mask film and the metal, an interface between the interlayer insulating film between the wirings and the metal, and an interface between the interlayer insulating film between the vias and the metal,
the modified layers have the composition containing a smaller number of carbon atoms and a larger number of oxygen atoms per unit volume than the inner part of the first insulating film corresponding to each of the modified layers, and
the number of carbon atoms per unit volume in the modified layers decreases in order of the modified layer between the interlayer insulating film between the wirings and the metal, the modified layer between the interlayer insulating film between the vias the metal and the modified layer between the hard mask film and the metal.

* * * * *